(12) United States Patent
Fujimoto

(10) Patent No.: US 11,386,935 B2
(45) Date of Patent: Jul. 12, 2022

(54) ELECTRONIC CIRCUIT AND SEMICONDUCTOR DEVICE

(71) Applicant: KIOXIA CORPORATION, Tokyo (JP)

(72) Inventor: Takumi Fujimoto, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/166,910

(22) Filed: Feb. 3, 2021

(65) Prior Publication Data
US 2021/0287722 A1    Sep. 16, 2021

(30) Foreign Application Priority Data

Mar. 13, 2020  (JP) .............................. JP2020-044333

(51) Int. Cl.
| | |
|---|---|
| *G11C 5/14* | (2006.01) |
| *H03K 19/20* | (2006.01) |
| *H02M 3/07* | (2006.01) |
| *G11C 8/08* | (2006.01) |

(52) U.S. Cl.
CPC .............. *G11C 5/145* (2013.01); *H02M 3/07* (2013.01); *H03K 19/20* (2013.01); *G11C 8/08* (2013.01)

(58) Field of Classification Search
None
See application file for complete search history.

(56) References Cited

U.S. PATENT DOCUMENTS

| | | | |
|---|---|---|---|
| 6,566,846 B1 | 5/2003 | Voo | |
| 8,902,691 B2 * | 12/2014 | Narui | G11C 5/145 |
| | | | 365/230.06 |
| 2016/0352217 A1 * | 12/2016 | Reddy | H02M 1/44 |

FOREIGN PATENT DOCUMENTS

| | | |
|---|---|---|
| JP | 3713267 B2 | 11/2005 |
| JP | 2009148000 A | 7/2009 |

* cited by examiner

*Primary Examiner* — Tan T. Nguyen
(74) *Attorney, Agent, or Firm* — Kim & Stewart LLP

(57) ABSTRACT

A charge pump circuit includes a first transistor having a drain connected to an input node, and a source connected to a first node; a second transistor having a drain connected to the first node, and a source connected to an output node; a first capacitor between the first and second nodes; a first inverter including an input node to which a clock signal is supplied and an output node connected to the second node via a first line; a first voltage detection circuit which includes an input node connected to the first line; a third transistor having a source connected to a third node, and a drain connected to the second node; a second inverter including an input node connected to the first voltage detection circuit and an output node connected to a fourth node via a second line; and a second capacitor between the third and fourth nodes.

18 Claims, 13 Drawing Sheets

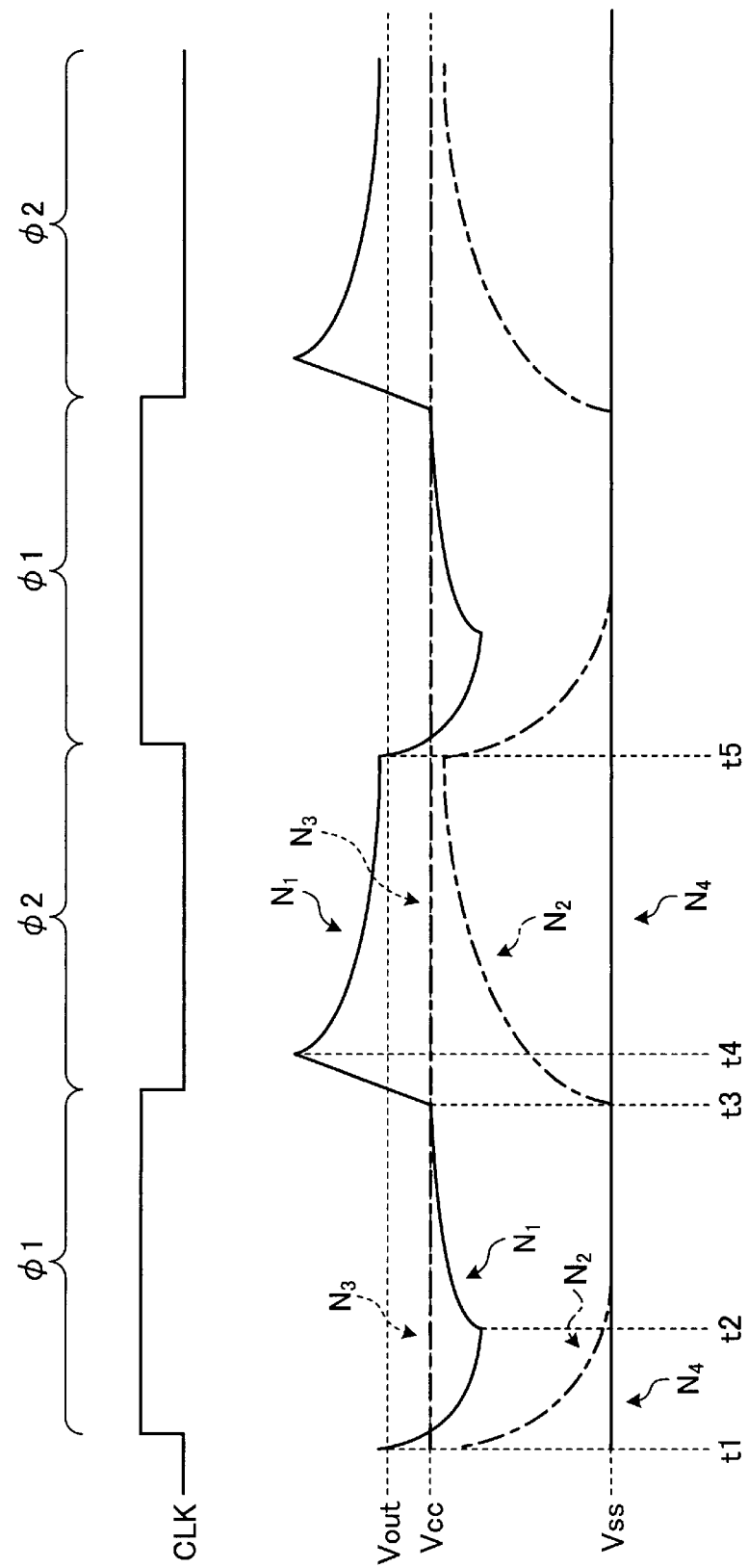

ELECTRONIC CIRCUIT AND SEMICONDUCTOR DEVICE

CROSS-REFERENCE TO RELATED APPLICATION

This application is based upon and claims the benefit of priority from Japanese Patent Application No. 2020-044333, filed on Mar. 13, 2020, the entire contents of which are incorporated herein by reference.

FIELD

Embodiments described herein relate generally to an electronic circuit and a semiconductor device, in particular a semiconductor storage device, equipped with the electronic circuit.

BACKGROUND

In a semiconductor device, particularly in a semiconductor storage device, in order to generate a voltage higher than the power supply voltage, a boosting operation using the power supply voltage may be performed with a charge pump circuit. Therefore, an electronic circuit that can appropriately perform the boosting operation using a power supply voltage is desired.

DESCRIPTION OF THE DRAWINGS

FIG. 5 is a waveform diagram illustrating an operation of the charge pump circuit (when the output voltage is low) according to the embodiment.

DETAILED DESCRIPTION

In general, embodiments provide an electronic circuit that can appropriately perform a boosting operation using a power supply voltage, and a semiconductor device, in particular a semiconductor storage device, equipped with the electronic circuit.

According to one embodiment, an electronic circuit including a charge pump circuit is provided. The charge pump circuit includes a first transistor having a drain connected to an input node, and a source connected to a first node; a second transistor having a drain connected to the first node, and a source connected to an output node; a first capacitive element having one end connected to the first node, and the other end connected to a second node; a first inverter which includes an input node to which a clock signal is supplied and an output node which is connected to the second node via a first line; a first voltage detection circuit which includes an input node electrically connected to the first line; a third transistor having a source connected to a third node, and a drain connected to the second node; a second inverter which includes an input node which is electrically connected to the first voltage detection circuit and an output node which is connected to a fourth node via a second line; and a second capacitive element having one end connected to the fourth node and the other end connected to the third node.

Hereinafter, an electronic circuit and a semiconductor device equipped with the electronic circuit are described with reference to the drawings. The present disclosure is not limited to the disclosed embodiments.

(Embodiment)

The semiconductor device equipped with the electronic circuit according to the embodiment includes a charge pump circuit and may perform a boosting operation using a power supply voltage with a charge pump circuit in order to generate a voltage higher than the power supply voltage. The semiconductor device may be a semiconductor storage device including a memory cell array. For example, in the semiconductor storage device, in order to control a memory cell array at a voltage higher than the power supply voltage, a boosting operation using the power supply voltage with a charge pump circuit may be performed.

Figure 1:
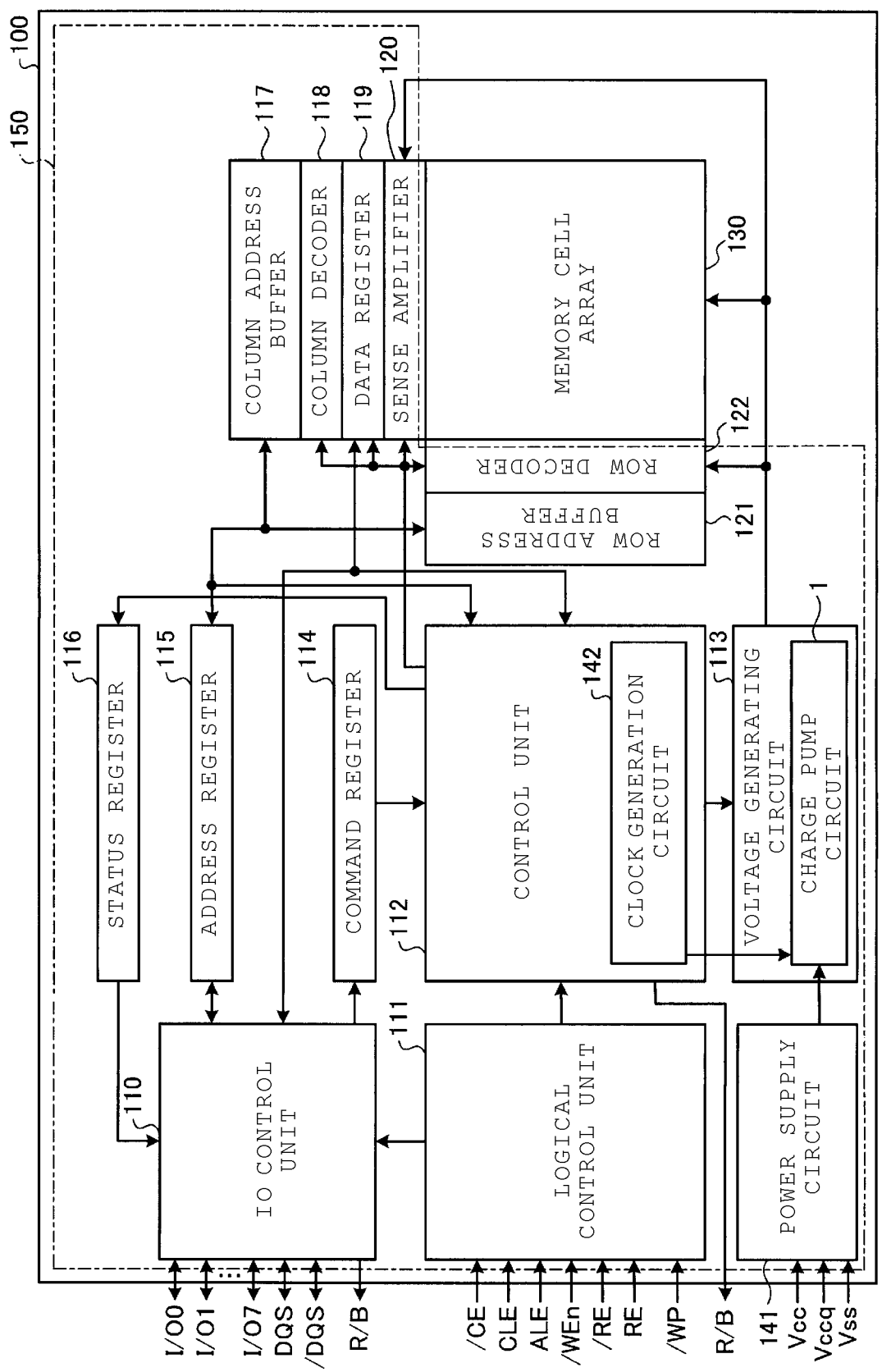
FIG. 1 is a diagram illustrating a configuration of a semiconductor device equipped with an electronic circuit according to an embodiment.

A semiconductor storage device 100 equipped with the electronic circuit according to the embodiment is, for example, a nonvolatile memory such as a NAND-type flash memory, and is configured as illustrated in FIG. 1.

The semiconductor storage device 100 includes a memory cell array 130 and a peripheral circuit 150.

The peripheral circuit 150 includes an I/O control unit 110, a logical control unit 111, a control unit 112, a voltage generating circuit 113, a command register 114, an address register 115, a status register 116, a column address buffer 117, a column decoder 118, a data register 119, a sense amplifier 120, a row address buffer 121, a row decoder 122, a power supply circuit 141, and a clock generation circuit 142.

The logical control unit 111 receives inputs of various control signals via input pins of various control signals (such as CE and ALE). The I/O control unit 110 assigns registers of storage targets of I/O signals based on the control signals received by the logical control unit 111. The logical control unit 111 transfers received control signals to the control unit 112. The input pin CE (shown as /CE) of the logical control unit 111 is a chip enable pin of the semiconductor storage device 100.

The control unit 112 controls all the operations of the semiconductor storage device 100 including an operation of a state transition circuit (state machine) that transitions a state based on the various control signals received via the logical control unit 111.

The I/O control unit 110 is a buffer circuit for transmitting and receiving I/O signals and strobe signals to and from a controller (not shown) via I/O signal pins I/O0 to I/O7 and strobe pins DQS and /DQS. Commands, addresses, data (write data) obtained by the I/O control unit 110 as the I/O signals via the I/O signal pins I/O0 to I/O7 are distributed and stored in the address register 115, the command register 114, and the data register 119, respectively.

The power supply circuit 141 receives, for example, power supply voltages Vcc, Vccq, and Vss from the controller via a power supply pin and supplies these voltages to each unit in the semiconductor storage device 100. The power supply voltage Vccq is, for example, a power supply voltage used in the operation of the I/O control unit 110. The power supply voltage Vss is, for example, a ground voltage.

The control unit 112 instructs a voltage value to be generated and a power supply timing to the voltage generating circuit 113. The control unit 112 includes the clock generation circuit 142. The clock generation circuit 142 supplies a clock signal CLK to, for example, a charge pump circuit 1. In addition, the control unit 112 transmits a ready/busy signal R/B to the controller.

The voltage generating circuit 113 generates a voltage according to the control of the control unit 112. The voltage generating circuit 113 includes the charge pump circuit 1. The charge pump circuit 1 receives, for example, the power supply voltage Vcc from the power supply circuit 141 and receives the clock signal CLK from the clock generation circuit 142. When generating a voltage higher than the power supply voltage Vcc, the voltage generating circuit 113 performs a boosting operation with the charge pump circuit 1. The voltage generating circuit 113 generates a predetermined voltage by the boosting operation of the charge pump circuit 1. The voltage generating circuit 113 supplies the generated voltage to the memory cell array 130, the row decoder 122, and the sense amplifier 120.

For example, the voltage generating circuit 113 supplies a voltage of about 5 V to 10 V to the row decoder 122 during a read operation and supplies a voltage of about 15 V to 25 V to the row decoder 122 during a write operation. That is, the charge pump circuit 1 is used for generating output voltages of different levels.

The status register 116 stores status information indicating whether the writing to the memory cell array 130 has succeeded and status information indicating whether reading from the memory cell array 130 has succeeded. The status information is transmitted as a response signal to the controller by the I/O control unit 110.

In the memory cell array 130, a plurality of memory cells are arranged. The memory cell array 130 stores write data from a host (not illustrated).

The row decoder 122, the column decoder 118, and the sense amplifier 120 access the memory cell array 130 based on the control by the control unit 112. The row decoder 122 selects a word line corresponding to a row address and activates the selected word line. The column decoder 118 selects a bit line corresponding to a column address and activates the bit line. The sense amplifier 120 applies a voltage to the bit line selected by the column decoder 118 and writes data stored in the data register 119 to a memory cell transistor positioned at an intersection of the word line selected by the row decoder 122 and the bit line selected by the column decoder 118. The sense amplifier 120 reads the data stored in the memory cell transistor positioned at the intersection of the word line selected by the row decoder 122 and the bit line selected by the column decoder 118 via the bit line and stores the read data in the data register 119. The data stored in the data register 119 is sent to the I/O control unit 110 through a data line and transferred to the outside of the I/O control unit 110 (for example, to a controller).

Figure 2A:
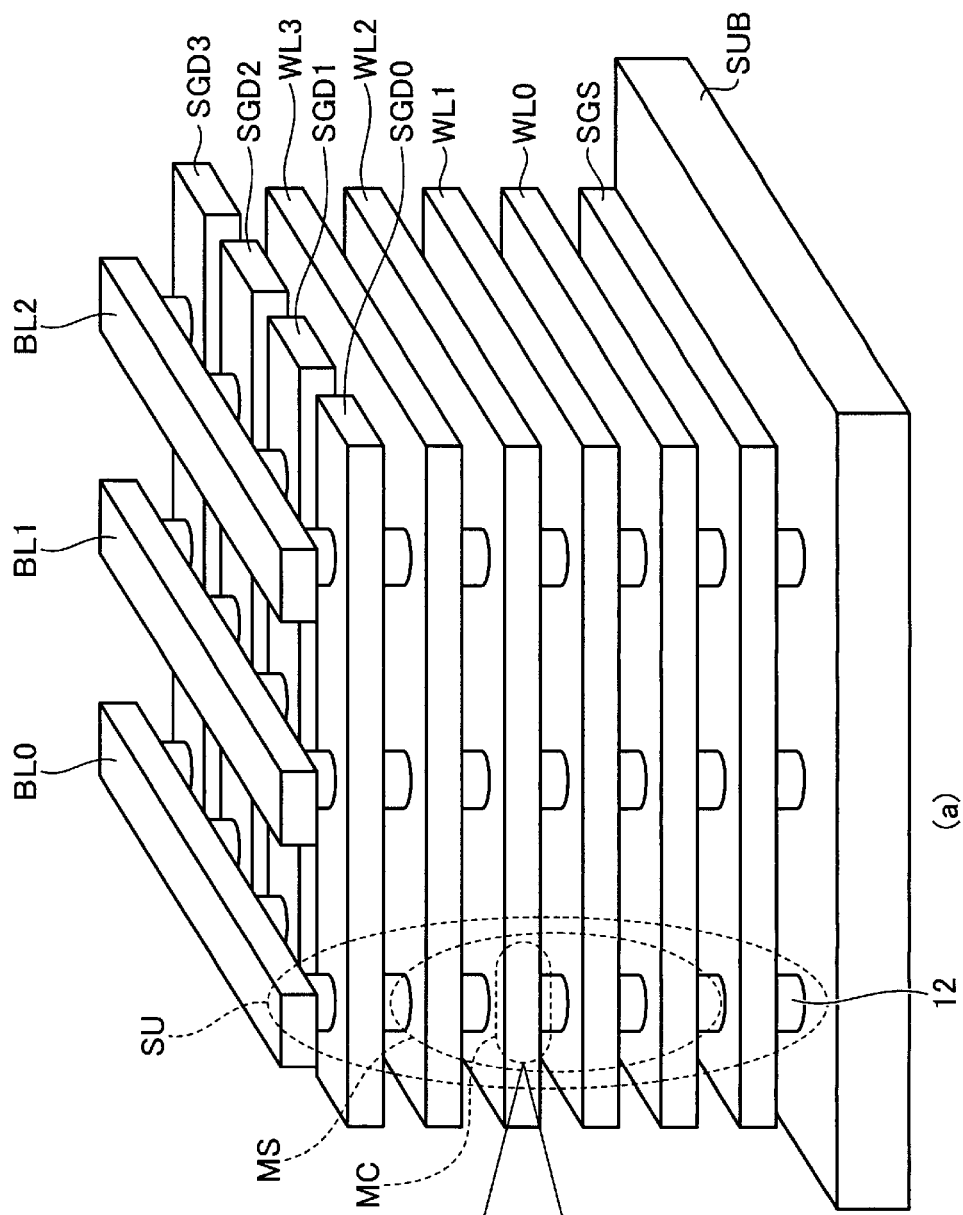
FIGS. 2A to 2B are diagrams illustrating a configuration of a memory cell array according to the embodiment.
Figure 2B:
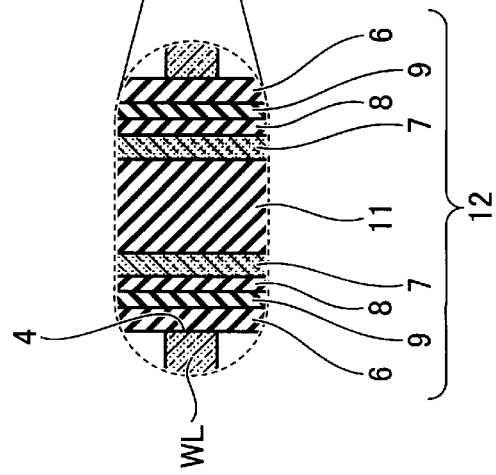

FIGS. 2A to 2B are diagrams illustrating a configuration of the memory cell array 130. FIG. 2A is a perspective view illustrating a schematic configuration of the memory cell array 130, and FIG. 2B is a cross-sectional view illustrating a schematic configuration of a part of memory cells MC of FIG. 2A. In the example of FIGS. 2A to 2B, four layers of the memory cells MC are stacked, and the four memory cells MC are connected in series so that memory strings MS are formed. In FIGS. 2A to 2B, for the sake of simplicity, an interlayer insulating film formed between impurity-added silicon layers 2 via a diffusion preventing layer 3 is not depicted.

In FIGS. 2A to 2B, a source side select gate electrode SGS is formed on a semiconductor substrate SUB. Instead of the semiconductor substrate SUB, a conductive layer may be used. A plurality of layers of word lines are stacked on the source side select gate electrode SGS. In FIGS. 2A to 2B, an example in which four layers of word lines WL0 to WL3 are stacked is illustrated. Drain side select gate electrodes SGD0 to SGD3 are formed on the uppermost layer of the word line WL3.

An extending direction of the drain side select gate lines SGD0 to SGD3 may be referred to as a "row" direction. The row direction is orthogonal with respect to a stacking direction of the source side select gate line SGS, the word lines WL0 to WL3, and the drain side select gate lines SGD0 to SGD3.

Columnar bodies 12 are formed to penetrate the drain side select gate lines SGD0 to SGD3, the word lines WL0 to WL3, and the source side select gate electrode SGS. String units SU include the drain side select gate electrodes SGD0 to SGD3, respectively. That is, the string unit SU is a unit that includes the plurality of memory strings MS arranged along the row direction and can be selectively accessed by the drain side select gate electrodes SGD0 to SGD3.

Bit lines BL0 to BL2 are formed on the drain side select gate electrodes SGD0 to SGD3. The extending direction of the bit lines BL0 to BL2 may be referred to as a "column" direction. The column direction is orthogonal with respect to the stacking direction of the source side select gate line SGS, the word lines WL0 to WL3, and the drain side select gate lines SGD0 to SGD3 and orthogonal with respect to the row direction. The columnar body 12 extends, for example, from the semiconductor substrate SUB to the bit lines BL0 to BL2.

The columnar body 12 is formed in a through via hole 4 penetrating the source side select gate electrode SGS, the word lines WL0 to WL3, and the drain side select gate lines SGD0 to SGD3. A columnar insulator 11 is formed in the center of the columnar body 12. As a material of the columnar insulator 11, for example, a silicon oxide film may be used.

The columnar insulator 11 is formed in the center of the columnar body 12. As the material of the columnar insulator 11, for example, a silicon oxide film may be used. A channel layer 7 is formed between the external surface of the columnar insulator 11 and the inner surface of the through via hole 4; a tunnel insulating film 8 is formed between the inner surface of the through via hole 4 and the channel layer 7; a charge trap layer 9 is formed between the inner surface of the through via hole 4 and the tunnel insulating film 8; and a block insulating film 6 is formed between the inner surface of the through via hole 4 and the charge trap layer 9. For example, the channel layer 7, the tunnel insulating film 8, the charge trap layer 9, and the block insulating film 6 are configured to penetrate the source side select gate electrode SGS, the word lines WL0 to WL3, and the drain side select gate lines SGD0 to SGD3, respectively. The channel layer 7 may include, for example, a semiconductor such as Si. The tunnel insulating film 8 and the block insulating film 6 may include, for example, a silicon oxide film. For example, a silicon nitride film or an ONO film (a three-layer structure of a silicon oxide film, a silicon nitride film, and a silicon oxide film) may be used for the charge trap layer 9.

FIGS. 2A to 2B depict a configuration in which four layers of the memory cells MC are stacked, and n layers (n is an integer of two or more) of the memory cells MC may be stacked.

According to the embodiment of FIGS. 2A to 2B, the columnar insulator 11 is formed in the center of the columnar body 12 to penetrate the source side select gate electrode SGS, the word lines WL0 to WL3, and the drain side select gate lines SGD0 to SGD3, and a columnar semiconductor may be embedded instead of the columnar insulator 11.

Figure 3:
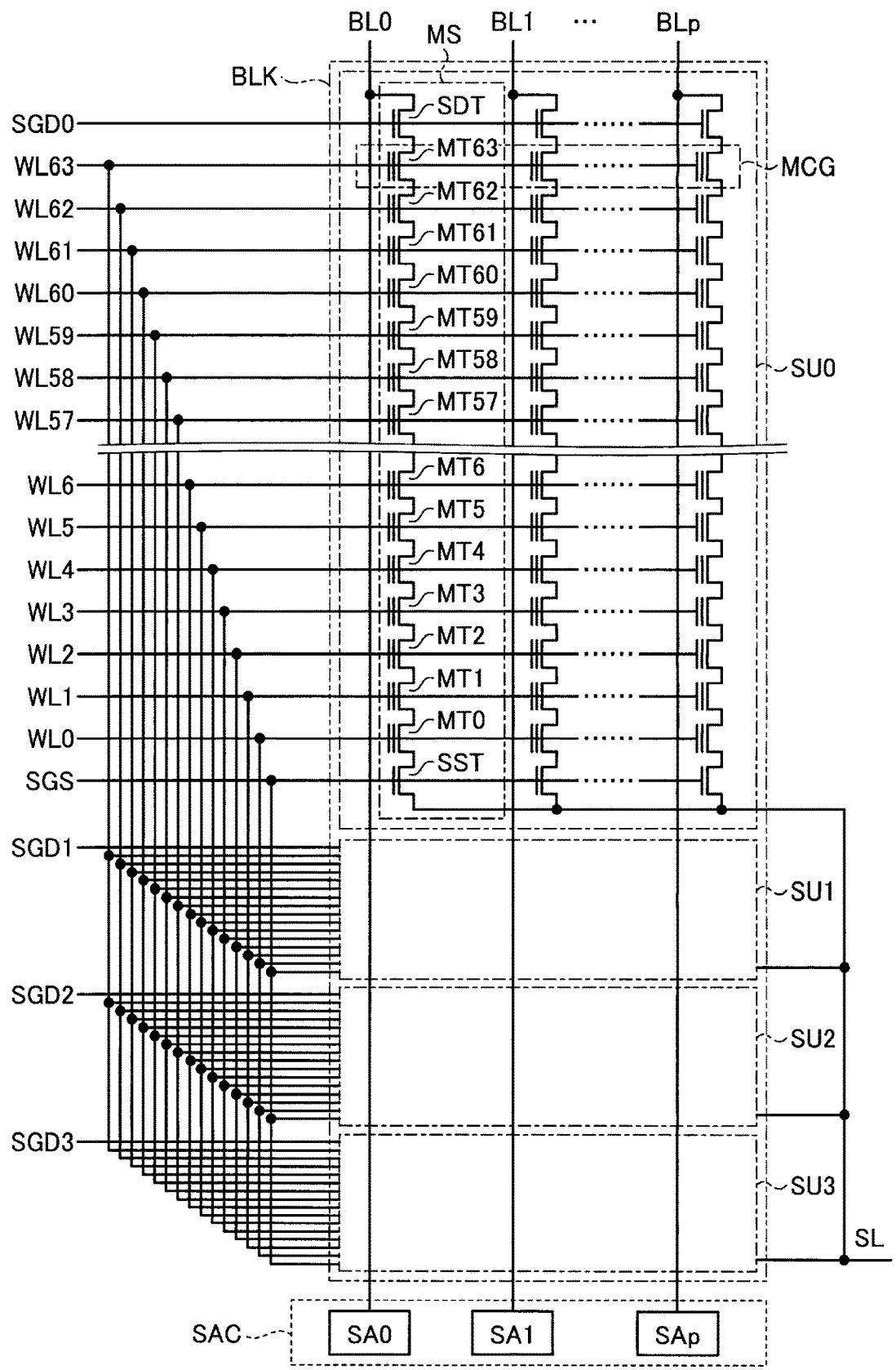
FIG. 3 is a circuit diagram illustrating a configuration of the memory cell array according to the embodiment.

The memory cell array 130 includes a plurality of blocks. Each block includes a plurality of memory cells at an intersecting position of a plurality of word lines and a plurality of bit lines. FIG. 3 is a circuit diagram illustrating a configuration example of one block.

A block BLK includes the plurality of string units SU0 to SU3. The plurality of string units SU0 to SU3 each include a corresponding one of drain side select gate lines SGD0 to SGD3 and share the source side select gate line SGS. The string units SU0 to SU3 can be selectively accessed by the drain side select gate lines SGD0 to SGD3. Each of the string units SU0 to SU3 includes the plurality of memory strings MS.

Each of the memory strings MS includes, for example, 64 memory cell transistors MT (MT0 to MT63) and select transistors SDT and SST. The memory cell transistor MT includes a control gate and a charge storage film, and stores data in a nonvolatile manner. Also, the 64 memory cell transistors MT (MT0 to MT63) are connected in series between the source of the select transistor SDT and the drain of the select transistor SST. The number of the memory cell transistors MT in the memory strings MS is not limited to 64.

Bit lines BL0 to BLp (denoted by BL when each bit line is not distinguished from one another) are connected to the memory strings MS. When the select transistor SDT is turned on, a channel area of each of the memory cell transistors MT in the memory strings MS is electrically connected to the bit line BL. Among a plurality of sense amplifiers SA0 to SAp in a sense amplifier circuit SAC, the corresponding sense amplifier SA is connected to each of the bit lines BL.

Word lines WL0 to WL63 (denoted by WL when each word line is not distinguished from one another) commonly connect control gates of the memory cell transistors MT between the memory strings MS in each of the string units SU in each of the physical blocks BLK. That is, the control gates of the memory cell transistors MT which are in the same row across all of the string units SU in the physical block BLK are connected to the same word line WL. That is, the string unit SU of the physical block BLK includes a plurality of memory cell groups MCG corresponding to the plurality of word lines WL, and each of the memory cell groups MCG includes (p+1) memory cell transistors MT connected to the same word line WL. When each of the memory cell transistors MT is configured to store a value of 1 bit (when the memory cell transistor MT is operated in a single-level cell (SLC) mode), the (p+1) memory cell transistors MT connected to the same word line WL (that is, the memory cell group MCG) are handled as one physical page, and a data write operation and a data read operation are performed for each physical page.

Each of the memory cell transistors MT may be configured to store a value of a plurality of bits. For example, when each of the memory cell transistors MT is configured to store a value of n (n≥2) bits, the storage capacity per the word line WL becomes the same as the size for n physical pages. That is, each of the memory cell groups MCG is handled as n physical pages. For example, in a multi-level cell (MLC) mode in which each of the memory cell transistors MT stores a value of 2 bits, data for two physical pages is stored in the memory cell transistors connected to each of the word lines WL. Otherwise, in a triple-level cell (TLC) mode in which each of the memory cell transistors MT stores a value of 3 bits, data for three physical pages is stored in the memory cell transistors connected to each of the word lines WL.

As illustrated in FIG. 1, the voltage generating circuit 113 of the semiconductor storage device 100 includes the charge pump circuit 1. The charge pump circuit 1 is a circuit that can generate a voltage, for example, higher than the power supply voltage Vcc. Generally, the power supply voltage of the semiconductor storage device 100 is about several volts. In contrast, the semiconductor storage device 100 may use a voltage of about ten to several tens of volts in a read operation, a write operation, and an erasing operation.

Here, for example, during the read operation, the voltage of about 5 V to 10 V is supplied from the voltage generating circuit 113 to the row decoder 122. For example, during the write operation, the voltage of about 15 V to 25 V is supplied from the voltage generating circuit 113 to the row decoder 122. Therefore, it is required that the charge pump circuit 1 can generate output voltages of different levels.

The charge pump circuit is configured, for example, by connecting capacitive elements and rectifying elements in multiple stages. With respect to the input voltage, a larger output voltage can be obtained by increasing the number of connection stages of the capacitive elements and the rectifying elements. For example, by the connection of the capacitive elements and the rectifying elements in N stages (N is an integer of 2 or more), the voltage corresponding to N+1 times the power supply voltage, can be generated.

However, in order to satisfy the output voltage range required by the specification of the charge pump circuit, when the number of connection stages in the charge pump circuit is simply increased, current consumption which is unnecessary may occur. An operation of the charge pumps of N stages corresponds to the preparation and the cascade connection of N sets of the charge pumps of a single stage, and at this time, the same charge and discharge currents of the capacitive elements are generated in the N sets for outputting a certain current, so there is current efficiency. For example, when the output voltage of the charge pump circuit is low (for example, when an output voltage corresponding to one to two times the power supply voltage may be obtained), a desired output voltage can be obtained by using only the capacitive element for one stage. However, in the case of the cascade connection of N stages, since it is required to transfer the current to the output end via all the capacitive elements for N stages, unnecessary current consumption is generated by the charge and discharge of the capacitive elements for (N−1) stages. Therefore, in order to provide a highly effective charge pump circuit, it is required to perform the operation in the appropriate number of stages according to the voltage required at the output end.

Here, according to the present embodiment, by enabling the number of stages of the capacitive elements and the rectifying elements used in the charge pump circuit 1 to be dynamically changed, the current efficiency of the charge pump circuit 1 is improved.

Specifically, the charge pump circuit 1 is configured as a series boost type in which a voltage detection circuit is added between the capacitive elements of the plurality of stages. That is, an intermediate node to which one end of the capacitive element of the first stage is connected is connected to an output node via a diode-connected transistor (which is equivalently, a diode). The charge pump circuit 1 charges the other end of the capacitive element of the first stage with electric charges for a predetermined period. At this time, the voltage detection circuit detects the voltage of the other end of the capacitive element of the first stage. If the output voltage is low, the diode-connected transistor is easily turned on, and a current path from the diode-connected transistor to the output node via the capacitive element of the first stage, is generated. In order to raise the voltage of the other end of the capacitive element of the first stage, it is required to supply electric charges transferred from the one end to the output node. Therefore, the capacitive load at the other end of the capacitive element of the first stage becomes large, and the time constant becomes large such that the electric charge is charged at a low speed. Since the electric charge is charged at the low speed with the large time constant at the other end of the capacitive element of the first stage, the detected voltage of the voltage detection circuit does not exceed the threshold voltage for a predetermined period, and the voltage detection circuit maintains outputting a signal in a non-active level to thereby deactivate the capacitive element of the second stage. A boosting operation using the capacitive element of one stage (of one step) is performed without using the capacitive element of the second stage. If the output voltage is raised, the diode-connected transistor is less likely to be turned on, and the current flowing from one end of the capacitive element of the first stage to the output node becomes smaller. In addition, the capacitive load at the other end becomes smaller, and the time constant becomes small such that the electric charge is charged at a high speed. Since the electric charge is charged at the high speed with the small time constant at the other end of the capacitive element of the first stage, the detected voltage of the voltage detection circuit exceeds the threshold voltage within the predetermined period, and the voltage detection circuit outputs a signal of an active level according to the detected voltage to thereby activate the capacitive element of the second stage. In the capacitive element of the second stage, one end is connected to the other end of the capacitive element of the first stage via the transfer transistor. If the capacitive element of the second stage is activated, the charge pump circuit 1 charges the other end of the capacitive element of the second stage with the electric charge, turns on the transfer transistor, and transfers the voltage accumulated in the capacitive element of the second stage to the other end of the capacitive element of the first stage. Therefore, a boosting operation of two steps using the capacitive elements of two stages is performed. As a result, since the charge pump circuit 1 can dynamically adjust the number of stages of the capacitive element and the number of steps of the boosting operation used according to the magnitude of the output voltage, the operation of the extra capacitive element can be prevented, and the generation of the excessive power consumption can be prevented. Therefore, the current efficiency of the charge pump circuit 1 can be improved.

Figure 4:
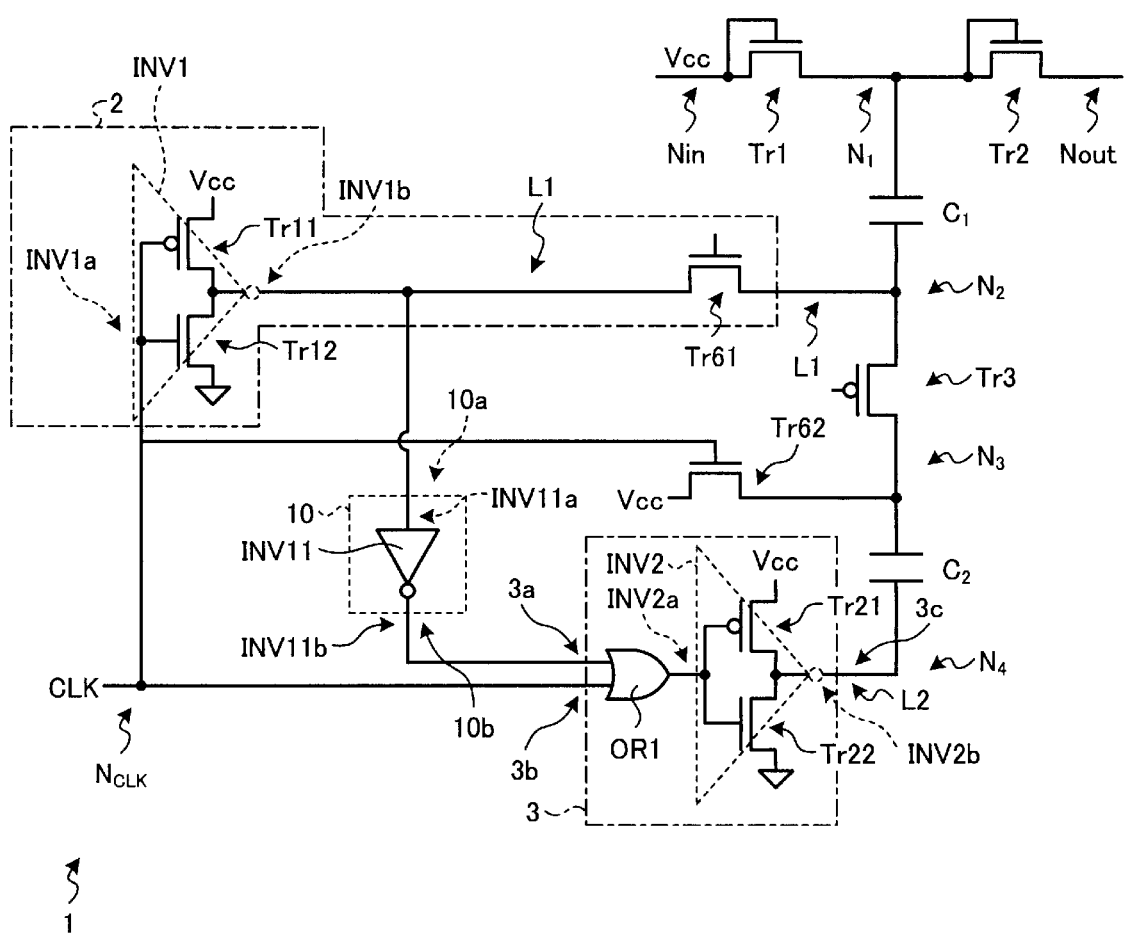
FIG. 4 is a circuit diagram illustrating a configuration of a charge pump circuit according to the embodiment.

Specifically, the charge pump circuit 1 may be configured as illustrated in FIG. 4. FIG. 4 is a circuit diagram illustrating a configuration of the charge pump circuit 1. The charge pump circuit 1 includes a transistor Tr1, a transistor Tr2, a capacitive element C1, a charge and discharge circuit 2, a voltage detection circuit 10, a transistor Tr3, a transistor Tr62, a capacitive element C2, and a charge and discharge circuit 3.

The transistor Tr1 and the transistor Tr2 are electrically connected in series between an input node Nin and an output node Nout of the charge pump circuit 1. The input node Nin is a node to which the power supply voltage Vcc is supplied. The output node Nout is a node to which a load circuit, which is to be an output target of the charge pump circuit 1 (for example, the row decoder 122 illustrated in FIG. 1), is electrically connected.

The transistor Tr1 and the transistor Tr2 are respectively diode-connected. The transistor Tr1 is configured, for example, with an NMOS transistor, a gate and a drain are electrically connected to each other and also electrically connected to the input node Nin, and a source is electrically connected to a node N1. The transistor Tr1 functions as a diode having a direction from the input node Nin to the node N1 as a forward direction. The transistor Tr2 is configured, for example, with an NMOS transistor, a gate and a drain are electrically connected to each other and connected to the node N1, and a source is electrically connected to the output node Nout. The transistor Tr2 functions as a diode having a direction from the input node N1 to the output node Nout as a forward direction.

The capacitive element C1 functions as the capacitive element of the first stage in the charge pump circuit 1. The capacitive element C1 is disposed between the node N1 and a node N2. In the capacitive element C1, one end is electrically connected to the node N1, and the other end is electrically connected to the node N2.

In the charge and discharge circuit 2, an input node is electrically connected to a clock node $N_{CLK}$ of the charge pump circuit 1, and an output node is electrically connected to the node N2. The clock node $N_{CLK}$ is a node to which the clock signal CLK is supplied. The charge and discharge circuit 2 supplies the electric charge to the node N2 by using the power supply voltage Vcc. The charge and discharge circuit 2 can charge the other end of the capacitive element C1 to the power supply voltage Vcc.

The charge and discharge circuit 2 includes an inverter INV1 and a transistor Tr61. The inverter INV1 includes an input node INV1a and an output node INV1b. The input node INV1a is electrically connected to the clock node $N_{CLK}$, and the clock signal CLK is supplied thereto. The output node INV1b can be connected to the node N2 via a line L1 and the transistor Tr61 and is electrically connected to the node N2 when the transistor Tr61 is turned on.

The inverter INV1 includes a transistor Tr11 and a transistor Tr12. The transistor Tr11 and the transistor Tr12 are connected to each other via an inverter. The transistor Tr11 is, for example, a PMOS transistor, having a source connected to the power supply voltage Vcc, a drain connected to the output node INV1b, and a gate connected to the input node INV1a. The transistor Tr12 is, for example, an NMOS transistor, having a source connected to a ground voltage, a drain connected to the output node INV1b, and a gate connected to the input node INV1a.

The transistor Tr61 is, for example, an NMOS transistor, having a source connected to the output node INV1b, a drain connected to the node N2, and a gate to which a predetermined signal is supplied. For example, the predetermined signal supplied to the gate of the transistor Tr61 is a signal obtained from the clock signal CLK. More specifically, when the clock signal CLK is in a period of the L level, the predetermined signal becomes an active level (for example, a voltage of Vcc+Vth), and when the clock signal CLK is in a period of the H level, the predetermined signal becomes a non-active level (for example, a ground voltage).

The transistor Tr61 has a function of alleviating a voltage load applied to the transistor Tr11 and the transistor Tr12 and improving breakdown voltage characteristics of the circuit. The transistor Tr61 has a function of preventing backflow of the current from the node N2 to the inverter INV1.

The voltage detection circuit 10 includes an input node 10a and an output node 10b. The input node 10a is electrically connected to a signal line L1 and is connected, for example, to a node between the output node INV1b and the transistor Tr61 in the signal line L1. The voltage detection circuit 10 can detect a voltage of the other end of the capacitive element C1 via the voltage of the signal line L1. The output node 10b is electrically connected to the charge and discharge circuit 3. The voltage detection circuit 10 can supply the detection result to the charge and discharge circuit 3.

The voltage detection circuit 10 is configured, for example, as an inverter INV11. The inverter INV11 includes an input node INV11a and an output node INV11b. The input node INV11a is connected to the input node 10a, and the output node INV11b is connected to the output node 10b.

The transistor Tr3 is disposed between the node N2 and a node N3. The transistor Tr3 functions as a transfer transistor for transferring the electric charge from the node N3 to the node N2. The transistor Tr3 is, for example, a PMOS transistor, having a source connected to the node N3, and a drain connected to the node N2.

The transistor Tr62 functions as a transistor for initializing the node N3 to a voltage Vcc. The transistor Tr62 is, for example, an NMOS transistor, having a gate connected to the clock node $N_{CLK}$, a source connected to the power supply voltage Vcc, and a drain connected to the node N3.

The capacitive element C2 functions as a capacitive element of the second stage in the charge pump circuit 1. The capacitive element C2 is disposed between the node N3 and a node N4. In the capacitive element C2, one end is electrically connected to the node N3, and the other end is electrically connected to the node N4. One end of the capacitive element C2 can be connected to the other end of the capacitive element C1 via the transistor Tr3 and the node N2.

The charge and discharge circuit 3 includes an input node 3a, an input node 3b, and an output node 3c. The input node 3a is electrically connected to the output node 10b of the voltage detection circuit 10. The input node 3b is electrically connected to the clock node $N_{CLK}$. The output node 3c is electrically connected to the node N4 via a line L2. The charge and discharge circuit 3 can charge the other end of the capacitive element C2 with the electric charge according to the detection result of the voltage detection circuit 10.

The charge and discharge circuit 3 includes an OR gate OR1 and an inverter INV2. In the OR gate OR1, a first input node is electrically connected to the input node 3a, a second input node is electrically connected to the input node 3b, and an output node is electrically connected to the inverter INV2. The inverter INV2 includes an input node INV2a and an output node INV2b. The input node INV2a is electrically connected to the output of the OR gate OR1, and the output node INV2b is electrically connected to the line L2 via the output node 3c.

The inverter INV2 includes a transistor Tr21 and a transistor Tr22. The transistor Tr21 and the transistor Tr22 are connected to each other via an inverter. The transistor Tr21 is, for example, a PMOS transistor, having a source connected to a power supply node INV2b, a drain connected to an output node INV2c, and a gate connected to the input node INV2a. The transistor Tr22 is, for example, an NMOS transistor, having a source connected to a ground voltage, a drain connected to the output node INV2c, and a gate connected to the input node INV2a.

Figure 6A:
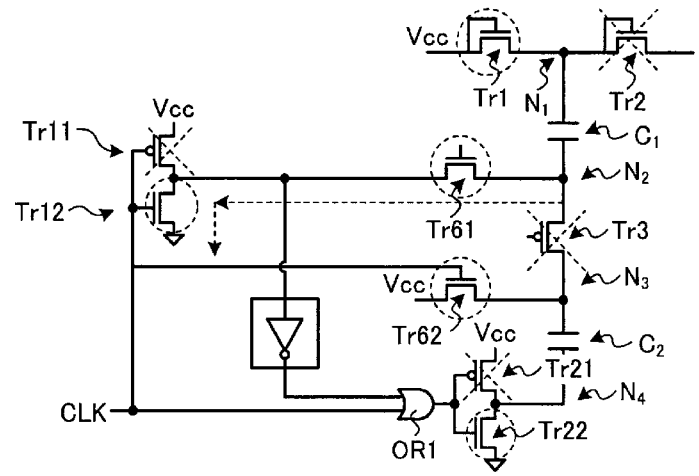
FIGS. 6A to 6C are diagrams illustrating the operation of the charge pump circuit according to the embodiment.
Figure 6B:
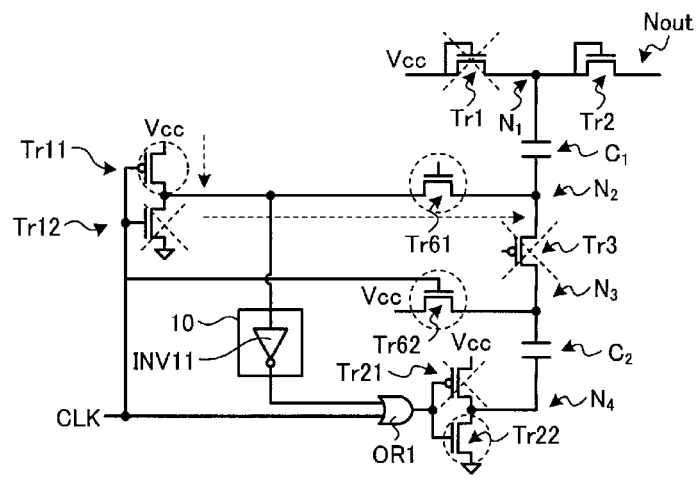
Figure 6C:
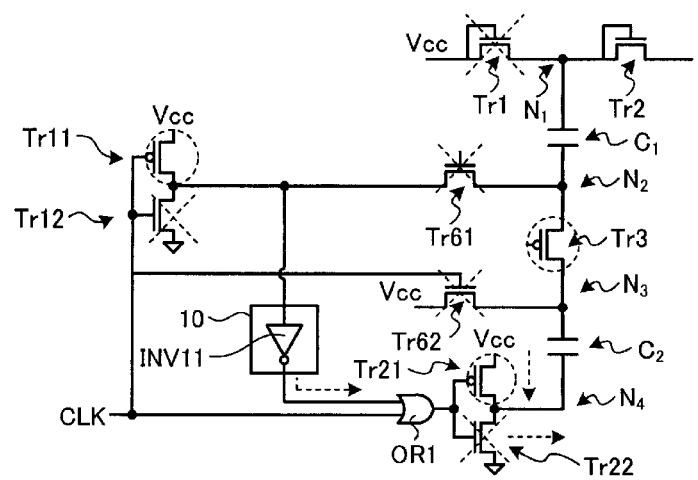
Figure 7:
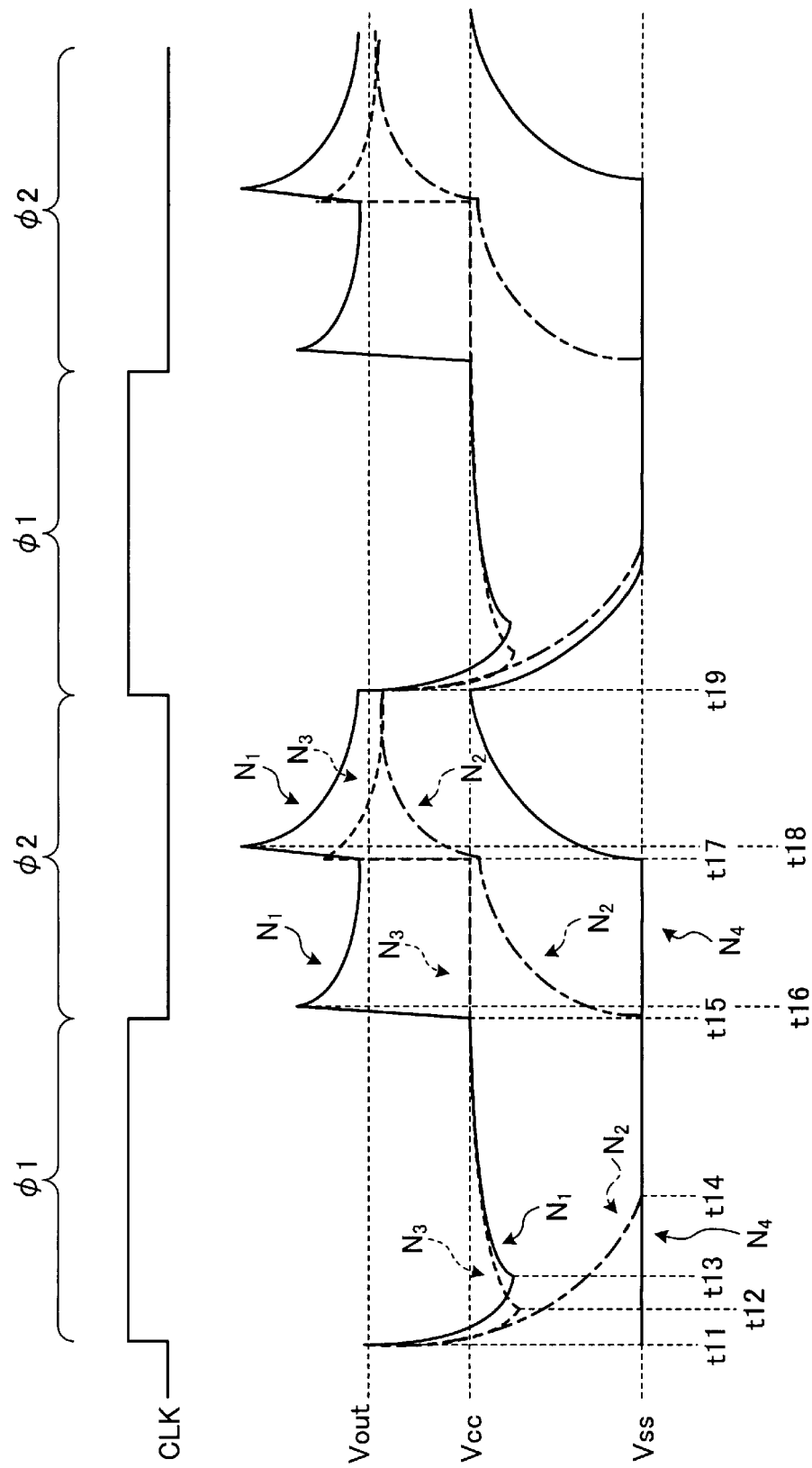
FIG. 7 is a waveform diagram illustrating an operation of the charge pump circuit (when the output voltage is medium) according to the embodiment.
Figure 8:
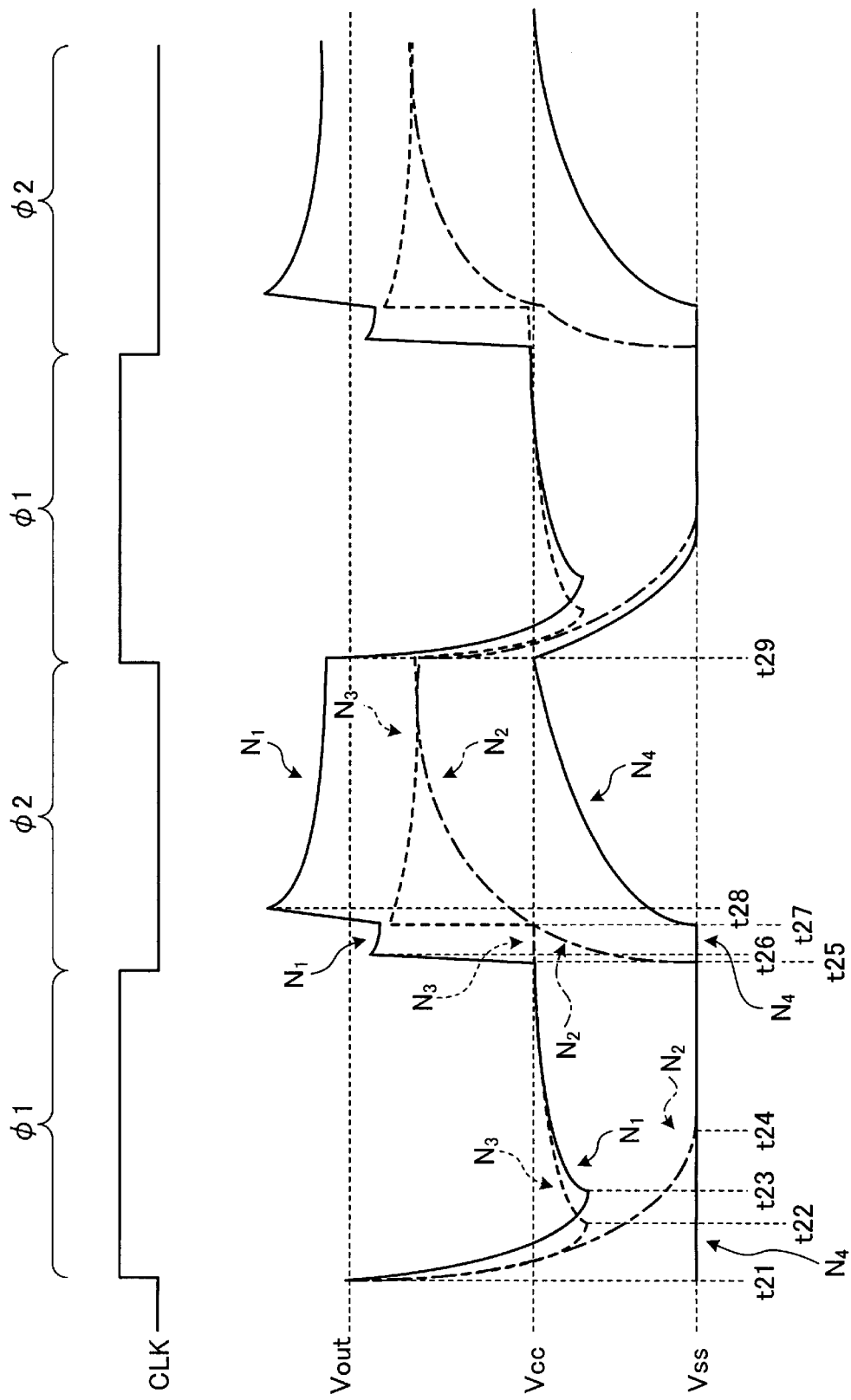
FIG. 8 is a waveform diagram illustrating an operation of the charge pump circuit (when the output voltage is high) according to the embodiment.

In the configuration illustrated in FIG. 4, in the charge pump circuit 1, the number of stages of the operation can be dynamically adjusted as illustrated in FIGS. 5 to 8. FIG. 5 is a waveform diagram illustrating an operation of the charge pump circuit (when the output voltage is low). FIGS. 6A to 6C are diagrams illustrating the operation of the charge pump circuit. FIG. 7 is a waveform diagram illustrating an operation of the charge pump circuit (when the output voltage is medium). FIG. 8 is a waveform diagram illustrating an operation of the charge pump circuit (when the output voltage is high).

In the operation according to the present embodiment, as illustrated in FIG. 5, one cycle of the clock signal CLK includes an initialization phase ϕ1 and a transfer phase ϕ2. The initialization phase ϕ1 is a period when the clock signal CLK is maintained to be at the H level, and the transfer phase ϕ2 is a period when the clock signal CLK is maintained to be at the L level. In the initialization phase ϕ1, one end of the capacitive elements C1 and C2 of each stage (a terminal on the upper side in FIG. 4) is connected to the power supply voltage Vcc, and the other end (a terminal on the lower side in FIG. 4) is connected to a ground, respectively. In the transfer phase ϕ2, if the other end of the capacitive element is boosted to a voltage higher than the power supply voltage Vcc, the voltage of the one end of the capacitive element is raised, and the electric charge is transferred from the output node Nout to the output target.

For example, when a load of an output voltage Vout is small and is about equal to the power supply voltage Vcc (e.g., about 1.25 in FIG. 5), the charge pump circuit 1 operates as illustrated in FIG. 5.

In a timing t1 when the initialization phase ϕ1 starts, if the clock signal CLK transitions from the L level to the H level, the transistor Tr11 is turned off as illustrated in FIG. 6A, and the transistor Tr12 is turned on. The transistor Tr61 is turned on, and the electric charge of the node N2 is discharged to the ground voltage via the transistor Tr61 and the transistor Tr12. In addition, the voltage of the node N2 decreases from the level of about the power supply voltage Vcc. At this time, the capacitive element C1 maintains the stored voltage, and thus the voltage of the node N1 decreases from the level of the output voltage Vout.

At a timing t2 illustrated in FIG. 5, the voltage of the node N2 decreases to the ground voltage Vss and is maintained to be at the ground voltage Vss. According to this, the capacitive element C1 maintains the stored voltage, and thus the voltage of the node N1 decreases to the level slightly lower than the power supply voltage Vcc. While the transistor Tr2 is maintained to be in the off state, the transistor Tr1 is turned on, and thereafter, the voltage of the node N1 returns to the level of the power supply voltage Vcc. For simplification of the example, the threshold voltage of the transistor Tr2 is assumed to be set at a sufficiently low level.

In the initialization phase φ1, since the transistor Tr3 is maintained to be in the off state, and the transistor Tr62 is maintained to be in the on state, and the node N3 is maintained to be at the level of the power supply voltage Vcc. Since the clock signal CLK is at the H level, and the OR gate OR1 outputs the H level, the transistor Tr21 is turned off, and the transistor Tr22 is turned on. Therefore, the node N4 is maintained to be at the ground voltage Vss.

At a timing t3 when the transfer phase φ2 starts, if the clock signal CLK transitions from the H level to the L level as illustrated in FIG. 5, the transistor Tr11 is turned on and the transistor Tr12 is turned off, as illustrated in FIG. 6B. The transistor Tr61 is turned on, and the electric charge is charged at the node N2 via the transistor Tr11 and the transistor Tr61 in accordance with the power supply voltage Vcc. In addition, the voltage of the node N2 is raised from the ground voltage Vss. The capacitive element C1 maintains the stored voltage, and thus the voltage of the node N1 is raised from the power supply voltage Vcc.

According to this, at a timing t4, the capacitive element C1 maintains the stored voltage, and the voltage of the node N1 is raised to a level higher than the output voltage Vout, but the transistor Tr2 (which is equivalently, a diode) is turned on, and a part of the electric charge starts to be transferred from one end of the capacitive element C1 to the output node Nout side. Therefore, the current path is generated from the power supply voltage Vcc to the output node Nout via the line L1 and the capacitive element C1, and the transistor Tr2.

For the period of the timings t4 to t5, in order to raise the voltage of the node N2, it is required to supply the current transferred to the output node Nout side, and thus, the capacitive load in the node N2 becomes large. Consequently, the time constant becomes large, and the capacitive element C1 is charged at a low speed. Simultaneously, the voltage of the node N1 is discharged from the level higher than the output voltage Vout to the output voltage Vout. The electric charge of the node N1 stored in the capacitive element C1 is transferred to the output node Nout side via the transistor Tr2. At this time, if the charging speed of the capacitive element C1 is low, and the voltage of the node N2 does not reach the set voltage, the voltage detection circuit 10 (the inverter INV11) continuously outputs the signal of the H level. Then, the OR gate OR1 also continuously outputs the H level, such that the transistor Tr21 is turned off, and the transistor Tr22 is turned on. Accordingly, the node N4 is maintained to be at the ground voltage Vss. At this time, the transistor Tr3 is turned off. Therefore, the voltages of the node N3 and the node N4 do not change together, and the capacitive element C2 remains deactivated.

The boosting operation of one step using the capacitive element C1 of one stage is performed without using the capacitive element C2 of the second stage. In the operation of FIG. 5, the charge pump operates as a charge pump of one stage for the relatively long period of the timings t4 to t5 to output the current.

After the timing t5, an operation which is the same as the operation for the timings t1 to t5 is performed.

For example, when the output voltage Vout is higher and about 1.5 times (about 1.65 times in FIG. 7) the power supply voltage Vcc, the charge pump circuit 1 operates as illustrated in FIG. 7.

At a timing t11 when the initialization phase φ1 starts, if the clock signal CLK transitions from the L level to the H level, the transistor Tr11 is turned off and the transistor Tr12 is turned on, as illustrated in FIG. 6A. The transistor Tr61 is turned on, the electric charge of the node N2 is discharged to the ground voltage via the transistor Tr61 and the transistor Tr12, and the voltage of the node N2 decreases from the level slightly lower than the output voltage Vout. At this time, since the capacitive element C1 maintains the stored voltage, the voltage of the node N1 decreases from the level of the output voltage Vout. Since the transistor Tr3 which is turned on is turned off, the voltage of the node N3 decreases from the level slightly lower than the output voltage Vout.

At a timing t12 illustrated in FIG. 7, the voltage of the node N3 decreases to the level lower than the power supply voltage Vcc, but since the transistor Tr62 is turned on, thereafter, the voltage of the node N3 returns to the level of the power supply voltage Vcc.

At a timing t13, the voltage of the node N1 decreases to the level slightly lower than the power supply voltage Vcc. Therefore, while the transistor Tr2 is maintained to be in the off state, the transistor Tr1 is turned on, and thereafter, the voltage of the node N1 returns to the level of the power supply voltage Vcc.

At a timing t14, the voltage of the node N2 decreases to the ground voltage Vss and thereafter is maintained to be at the ground voltage Vss. Though not illustrated, since the clock signal CLK is at the H level, and the OR gate OR1 outputs the H level, the transistor Tr21 is turned off, and the transistor Tr22 is turned on. Therefore, the node N4 is maintained to be at the ground voltage Vss.

At a timing t15 when the transfer phase φ2 starts, if the clock signal CLK transitions from the H level to the L level, the transistor Tr11 is turned on and the transistor Tr12 is turned off, as illustrated in FIG. 6B. The transistor Tr61 is turned on, the electric charge is charged at the node N2 via the transistor Tr11 and the transistor Tr61 in accordance with the power supply voltage Vcc, and the voltage of the node N2 is raised from the ground voltage Vss.

According to this, at a timing t16, since the capacitive element C1 maintains the stored voltage, the voltage of the node N1 is raised from the power supply voltage Vcc to the level higher than the output voltage Vout, but the transistor Tr2 (which is equivalently, the diode) is turned on, a part of the electric charge starts to be transferred from one end of the capacitive element C1 to the output node Nout side. At this time, compared with the case of FIG. 5, the current path from the power supply voltage Vcc to the output node Nout via the line L1, the capacitive element C1, and the transistor Tr2, is less likely generated.

For the period of the timings t16 to t17, since the voltage of the node N2 is raised, the current transferred to the output node Nout side is supplied more easily than in the case of FIG. 5, and the capacitive load in the node N2 becomes smaller. Consequently, the time constant becomes smaller than in the case of FIG. 5, the capacitive element C1 is charged at a high speed. Simultaneously, the voltage of the node N1 is discharged from the level higher than the output voltage Vout to the level of the output voltage Vout. Together with this, the electric charge of the node N1 stored in the capacitive element C1 is transferred to the output node Nout side via the transistor Tr2. At this time, the charging speed of the node N2 is faster than in the case of FIG. 5, and the voltage is raised more quickly than in the case of FIG. 5. Therefore, the boosting operation of the first step is performed.

Therefore, at the timing t17, the voltage of the node N2 reaches a certain set voltage, the detected voltage of the voltage detection circuit 10 (the inverter INV11) exceeds the threshold voltage, and according to this, the signal of the L level is output to the OR gate OR1 as illustrated in FIG. 6C. Since the OR gate OR1 outputs the L level, the transistor Tr21 is turned on, and the transistor Tr22 is turned off. The electric charge is charged at the node N4 via the transistor Tr21 in accordance with the power supply voltage Vcc, and the voltage of the node N4 is raised from the ground voltage Vss to the power supply voltage Vcc. According to this, since the capacitive element C2 maintains the stored voltage, the voltage of the node N3 is raised from the power supply voltage Vcc to the level higher than the output voltage Vout. At this time, if the transistors Tr61 and Tr62 are turned off and the transistor Tr3 is turned on, the electric charge of the node N3 is transferred to the node N2 via the transistor Tr3, the node N2 is charged, and the voltage of the node N2 is raised. According to this, since the capacitive element C1 maintains the stored voltage, the voltage of the node N1 is raised from the level that is about equal to the output voltage Vout.

At a timing t18, since the capacitive element C1 maintains the stored voltage, if the voltage of the node N1 is raised to the level higher than the output voltage Vout, the transistor Tr2 (which is equivalently, the diode) is turned on, a part of the electric charge starts to be transferred from one end of the capacitive element C1 to the output node Nout side. At this time, compared with the case of FIG. 5, the current path from the power supply voltage Vcc to the output node Nout via the line L1, the capacitive element C1, and the transistor Tr2, is less likely generated.

Therefore, for the period of the timings t18 to t19, the electric charge transferred from the node N2 to the output node Nout side is more easily compensated than in the case of FIG. 5, and the capacitive load in the node N2 becomes smaller. Consequently, the time constant becomes smaller than in the case of FIG. 5, and the capacitive element C1 is charged at a higher speed. Simultaneously, the voltage of the node N1 is discharged from the level higher than the output voltage Vout to the level of the output voltage Vout. Together with this, the electric charge of the node N1 stored in the capacitive element C1 is transferred to the output node Nout side via the transistor Tr2. The electric charge of the node N3 stored in the capacitive element C2 is transferred to the node N2. At this time, the charging speed of the node N2 is faster than that in the case of FIG. 5, and the voltage is raised more quickly than that in the case of FIG. 5. Accordingly, the boosting operation of the second step is performed.

At the timing t19, the voltage of the node N2 reaches the level slightly lower than the output voltage Vout, and the voltage of the node N3 reaches the level slightly lower than the output voltage Vout, and the node N2 and the node N3 can be almost the same voltage.

Accordingly, the boosting operation of two steps is performed by using the capacitive element C1 of one stage and the capacitive elements C1 and C2 of two stages. Therefore, in the operation of FIG. 7, the operation as the charge pump of one stage is performed for the period of the timings t16 to t17, the operation as the charge pump of two stages is performed for the period of the timings t18 to t19, and the current is output.

After the timing t19, the operation which is the same as the operation to the timings t11 to t19 is performed.

For example, when the load of the output voltage Vout is large and is about two times the power supply voltage Vcc (about 2.25 times in FIG. 8), the charge pump circuit 1 operations as illustrated in FIG. 8.

At a timing t21, when the initialization phase φ1 starts, if the clock signal CLK transitions from the L level to the H level, the transistor Tr11 is turned off and the transistor Tr12 is turned on, as illustrated in FIG. 6A. The transistor Tr61 is turned on, the electric charge of the node N2 is discharged to the ground voltage via the transistor Tr61 and the transistor Tr12, the voltage of the node N2 decreases from the level of about the intermediate of the output voltage Vout and the power supply voltage Vcc. At this time, since the capacitive element C1 maintains the stored voltage, the voltage of the node N1 decreases from the level of the output voltage Vout. Since the transistor Tr3 which is turned on is turned off, the voltage of the node N3 decreases from the level of about the intermediate of the output voltage Vout and the power supply voltage Vcc.

At a timing t22 illustrated in FIG. 8, since the voltage of the node N3 decreases to the level lower than the power supply voltage Vcc, the transistor Tr62 is turned on, and thereafter, the voltage of the node N3 returns to the power supply voltage Vcc.

At the timing t23, the voltage of the node N1 decreases to the level slightly lower than the power supply voltage Vcc. While the transistor Tr2 is maintained to be in the off state, the transistor Tr1 is turned on, and thereafter, the voltage of the node N1 returns to the power supply voltage Vcc.

At a timing t24, the voltage of the node N2 decreases to the ground voltage Vss, and thereafter, is maintained to be at the ground voltage Vss. Though not illustrated, since the clock signal CLK is at the H level and the OR gate OR1 outputs the H level, the transistor Tr21 is turned off, and the transistor Tr22 is turned on. Therefore, the node N4 is maintained to be at the ground voltage Vss.

At a timing t25 when the transfer phase φ2 starts, if the clock signal CLK transitions from the H level to the L level, the transistor Tr11 is turned on and the transistor Tr12 is turned off, as illustrated in FIG. 6B. The transistor Tr61 is turned on, the electric charge is charged at the node N2 via the transistor Tr11 and the transistor Tr61 in accordance with the power supply voltage Vcc, and the voltage of the node N2 is raised from the ground voltage Vss. According to this, since the capacitive element C1 maintains the stored voltage, the voltage of the node N1 is raised from the power supply voltage Vcc.

At a timing t26, since the capacitive element C1 maintains the stored voltage, the voltage of the node N1 is raised to the level slightly lower than the output voltage Vout, but the transistor Tr2 (which is equivalently, the diode) is turned off, and a part of the electric charge is less likely to be transferred from one end of the capacitive element C1 to the output node Nout side. At this time, the current path from the power supply voltage Vcc to the output node Nout via the line L1, the capacitive element C1, and the transistor Tr2, is less likely to be generated compared with the case of FIG. 7.

For the period of the timings t26 to t27, the capacitive load in the node N2 is small. Consequently, the time constant becomes smaller, and charging is performed at a high speed. Simultaneously, the voltage of the node N1 almost maintains the level slightly lower than the output voltage Vout. At this time, the charging speed of the node N2 is the high speed, and the voltage is raised more quickly than that in the case of FIG. 7. Therefore, the boosting operation of the first step is performed.

At a timing t27, the voltage of the node N2 reaches the level of about the power supply voltage Vcc, and the detected voltage of the voltage detection circuit 10 (the inverter INV11) exceeds the threshold voltage, and according to this, the signal of the L level is output to the OR gate OR1, as illustrated in FIG. 6C. Since the OR gate OR1 outputs the L level, the transistor Tr21 is turned on, and the transistor Tr22 is turned off. The electric charge is charged at the node N4 via the transistor Tr21 in accordance with the power supply voltage Vcc, and the voltage of the node N4 is raised from the ground voltage Vss to the power supply voltage Vcc. According to this, since the capacitive element C2 maintains the stored voltage, the voltage of the node N3 is raised from the power supply voltage Vcc to the level slightly lower than the output voltage Vout. At this time, if the transistors Tr61 and Tr62 are turned off, and the transistor Tr3 is turned on, the electric charge of the node N3 is transferred to the node N2 via the transistor Tr3, the node N2 is charged, and the voltage of the node N2 is raised. According to this, since the capacitive element C1 maintains the stored voltage, the voltage of the node N1 is raised from the level slightly lower than the output voltage Vout.

At a timing t28, since the capacitive element C1 maintains the stored voltage, if the voltage of the node N1 is raised to the level higher than the output voltage Vout, the transistor Tr2 (which is equivalently, the diode) is turned on, and a part of the electric charge starts to be transferred from one end of the capacitive element C1 to the output node Nout side. At this time, the current path from the power supply voltage Vcc to the output node Nout via the line L1, the capacitive element C1, and the transistor Tr2, is less likely to be generated compared with the case of FIG. 7.

For the period of the timings t28 to t29, the charging time for raising the voltage of the node N2 is short. Consequently, the time constant becomes smaller, and charging is performed at a high speed. Simultaneously, the voltage of the node N1 is discharged from the level higher than the output voltage Vout to the level of the output voltage Vout. Together with this, the electric charge of the node N1 is discharged to the output node Nout side via the transistor Tr2. Since the discharging speed from the node N3 is fast, discharging from the node N3 is performed with a large time constant at a high speed. At this time, the charging speed to the node N2 is the high speed, and the voltage is raised more quickly compared with the case of FIG. 7. Therefore, the boosting operation of the second step is performed.

At a timing t29, the voltage of the node N2 reaches the level of about the intermediate of the output voltage Vout and the power supply voltage Vcc, the voltage of the node N3 reaches the level of about the intermediate of the output voltage Vout and the power supply voltage Vcc, and the node N2 and the node N3 can have almost the same voltage.

Therefore, the boosting operations of two steps using the capacitive element C1 of one stage and the capacitive elements C1 and C2 of two stages are performed. In the operation of FIG. 8, the operation as the charge pump of one stage is performed for the period of the timings t26 to t27, the operation as the charge pump of two stages is performed for period of the timings t28 to t29, and the current is output.

After the timing t29, the operation which is the same as the operation to the timings t21 to t29 is performed.

As described above, in the first embodiment, the capacitive element used in the charge pump circuit 1 and the number of stages of the rectifying element can be dynamically changed. For example, the charge pump circuit 1 includes the basic configuration of a charge pump of the series boost type, while the voltage detection circuit 10 is added between the capacitive elements C1 to C2 of the multiple stages. Since the charge pump circuit 1 can dynamically adjust the number of stages of the capacitive element and the number of steps of the boosting operations used according to the magnitude of the output voltage, an operation of an extra capacitive element can be prevented, and the generation of the excessive power consumption can be prevented. Therefore, the current efficiency of the charge pump circuit 1 can be improved.

Figure 9:
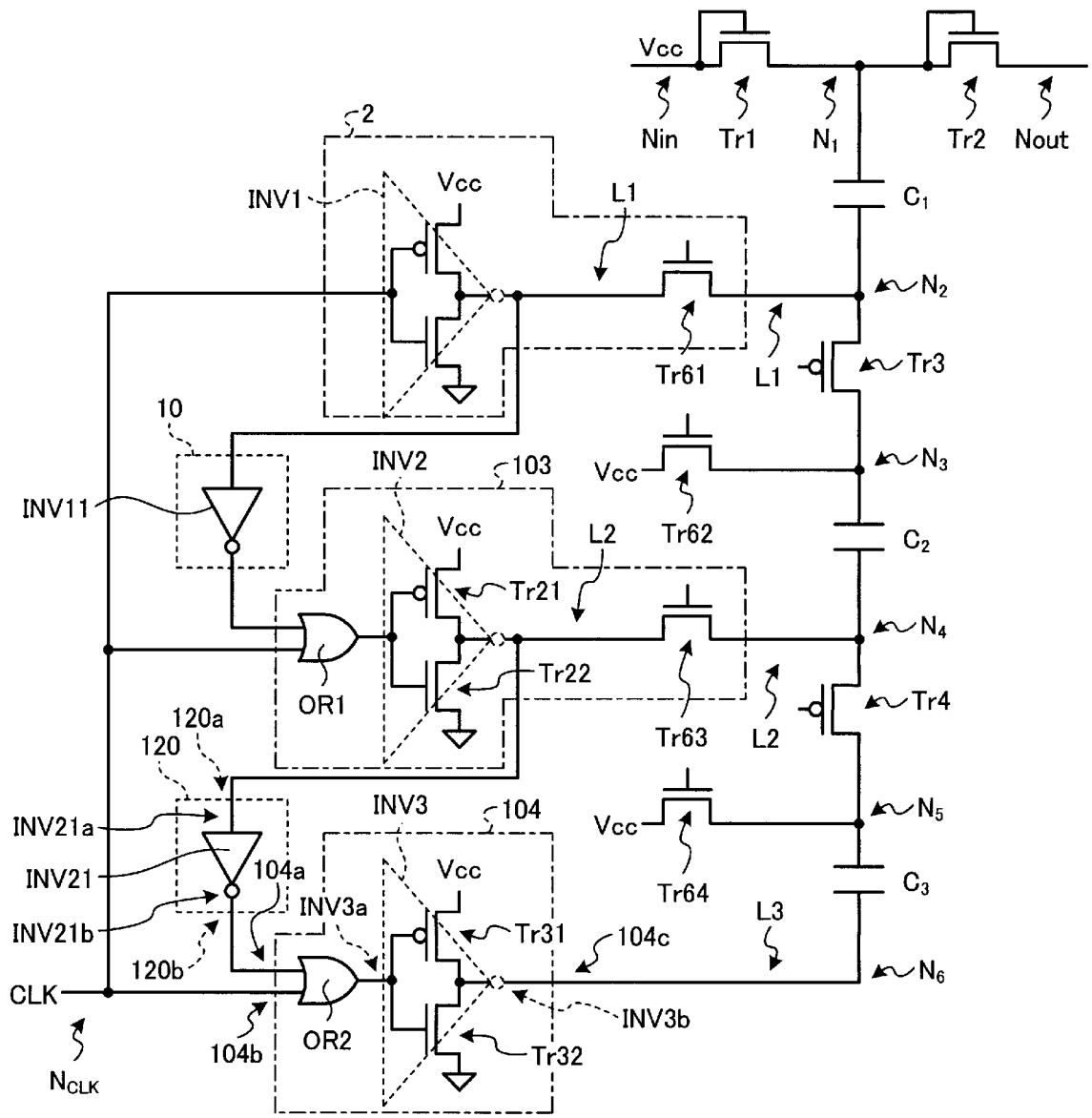
FIG. 9 is a circuit diagram illustrating a configuration of a charge pump circuit according to a first modification example of the embodiment.

As illustrated in FIG. 9, a voltage detection circuit between the capacitive elements C1 to C3 of three stages may be added to a charge pump circuit 101. FIG. 9 is a circuit diagram illustrating a configuration of the charge pump circuit 101 according to a first modification example of the embodiment.

The charge pump circuit 101 includes a charge and discharge circuit 103 instead of the charge and discharge circuit 3 (refer to FIG. 4) and further includes a voltage detection circuit 120, a transistor Tr4, a capacitive element C3, and a charge and discharge circuit 104.

The charge and discharge circuit 103 includes a transistor Tr63 in addition to the OR gate OR1 and the inverter INV2. The transistor Tr63 is, for example, an NMOS transistor, having a source connected to an output node of the inverter INV2, a drain connected to the node N4, and a gate to which a predetermined signal is supplied. For example, the predetermined signal supplied to the gate of the transistor Tr63 is a signal obtained from the clock signal CLK. More specifically, when the clock signal CLK is in a period of the L level, the predetermined signal becomes an active level (for example, a voltage of Vcc+Vth), and when the clock signal CLK is in a period of the H level, the predetermined signal becomes a non-active level (for example, a ground voltage).

The transistor Tr63 has a function of alleviating the voltage load applied to the transistor Tr21 and the transistor Tr22 and improving the breakdown voltage characteristics of the circuit. The transistor Tr63 has a function of preventing backflow of the current from the node N4 to the inverter INV2.

The voltage detection circuit 120 has an input node 120a and an output node 120b. The input node 120a is electrically connected to the signal line L2, and is connected, for example, to a node between an output node of the inverter INV2 and the transistor Tr63 in the signal line L2. Accordingly, the voltage detection circuit 120 can detect the voltage of the other end of the capacitive element C2 via the voltage of the signal line L2. The output node 120b is electrically connected to the charge and discharge circuit 104. The voltage detection circuit 120 can supply the detection result to the charge and discharge circuit 104.

The voltage detection circuit 120 includes an inverter INV21. The inverter INV21 includes an input node INV21a and an output node INV21b. The input node INV21a is connected to the input node 120a, and the output node INV21b is connected to the output node 120b.

The transistor Tr4 is disposed between the node N4 and a node N5. The transistor Tr4 is, for example, a PMOS transistor, having a source connected to the node N5, and a drain connected to the node N4.

A transistor Tr64 functions as a transistor for initializing the node N5 to the voltage Vcc. The transistor Tr64 is, for example, an NMOS transistor, having a gate connected to the clock node $N_{CLK}$, a source connected to a power supply voltage Vcc, and a drain connected to the node N5.

The capacitive element C3 functions as the capacitive element at the third stage in the charge pump circuit 101. The capacitive element C3 is disposed between the node N5 and a node N6. In the capacitive element C3, one end is electrically connected to the node N5, and the other end is electrically connected to the node N6. One end of the capacitive element C3 can be connected to the other end of the capacitive element C2 via the transistor Tr4 and the node N4.

The charge and discharge circuit 104 includes an input node 104a, an input node 104b, and an output node 104c. The input node 104a is electrically connected to the output node 120b of the voltage detection circuit 120. The input node 104b is electrically connected to the clock node $N_{CLK}$. The output node 104c is electrically connected to the node N6 via the line L2. The charge and discharge circuit 104 can charge the electric charge at the other end of the capacitive element C3 according to the detection result of the voltage detection circuit 120.

The charge and discharge circuit 104 includes an OR gate OR2 and an inverter INV3. In the OR gate OR2, a first input node is electrically connected to the input node 104a, a second input node is electrically connected to the input node 104b, and an output node is electrically connected to the inverter INV3. The inverter INV3 includes an input node INV3a and an output node INV3b. The input node INV3a is electrically connected to the OR gate OR2, and the output node INV3b is electrically connected to a line L3 via the output node 104c.

The inverter INV3 includes a transistor Tr31 and a transistor Tr32. The transistor Tr31 and the transistor Tr32 are connected to each other via an inverter. The transistor Tr31 is, for example, a PMOS transistor, having a source connected to the power supply voltage Vcc, a drain connected to the output node INV3b, and a gate connected to the input node INV3a. The transistor Tr32 is, for example, an NMOS transistor, having a source connected to a ground voltage, a drain connected to the output node INV3b, and a gate connected to the input node INV3a.

In the charge pump circuit 101 illustrated in FIG. 9, the charge pump circuit 101 charges the electric charge at the node N2 of the other end of the capacitive element C1 of the first stage in the transfer phase φ2 of the clock cycle. At this time, the voltage detection circuit 10 detects the voltage of the node N2 of the other end of the capacitive element C1 of the first stage.

If the output voltage is lower than $V_0$ (for example, about 1.5 times the power supply voltage Vcc), since the transistor Tr2 is easily turned on, the electric charge is easily transferred from one end of the capacitive element C1 of the first stage to the output node Nout side, and the current path from the power supply voltage Vcc to the output node Nout via the line L1, the capacitive element C1, and the transistor Tr2, is easily generated. Thus, it is necessary to supply the current transferred to the output node Nout side in order to raise the voltage of the other end of the capacitive element C1 of the first stage, so that the capacitive load at the other end of the capacitive element C1 of the first stage becomes large. Consequently, since the time constant becomes large, and the capacitive element C1 is charged at a low speed, the voltage detection circuit 10 continuously outputs the signal of the non-active level and the capacitive element C2 of the second stage remains deactivated. The voltage detection circuit 120 continuously outputs the signal of the non-active level, and the capacitive element C3 at the third stage remains deactivated. The boosting operation (of one step) using the capacitive element C1 of one stage is performed without using the capacitive element C2 of the second stage and the capacitive element C3 of the third stage.

If the output voltage is a value higher than $V_0$ and lower than $V_1$ (refer to FIG. 12B), the transistor Tr2 is less likely to be turned on, and the electric charge is less likely to be transferred from one end of the capacitive element C1 of the first stage to the output node Nout side. The current path from the power supply voltage Vcc to the output node Nout via the line L1, the capacitive element C1, and the transistor Tr2, is less likely to be generated, and the capacitive load at the other end of the capacitive element C1 of the first stage becomes smaller. Consequently, since the time constant becomes smaller and the capacitive element C1 is charged at a high speed, the voltage detection circuit 10 outputs the signal of the active level and the capacitive element C2 of the second stage is activated. If the capacitive element C2 of the second stage is activated, the charge pump circuit 101 charges the electric charge at the node N4 of the other end of the capacitive element C2 of the second stage, and thereafter, the transistor Tr3 is turned on so that the electric charge accumulated in the capacitive element C2 of the second stage is transferred to the other end of the capacitive element C1 of the first stage. At this time, the capacitive load at the other end of the capacitive element C2 is relatively large, and the rising speed of the voltage of the line L2 is slow. The voltage detection circuit 120 continuously outputs the signal of the non-active level and the capacitive element C3 of the third stage remains deactivated. The boosting operation of two steps using the capacitive elements C1 and C2 of two stages is performed without using the capacitive element C3 of the third stage.

If the output voltage is a value higher than $V_1$, the transistor Tr2 is much less likely to be turned on, the electric charge is less likely to be transferred from one end of the capacitive element C1 of the first stage to the output node Nout side. The current path from the power supply voltage Vcc to the output node Nout via the line L1, the capacitive element C1, and the transistor Tr2, is less likely to be generated, and the capacitive load at the other end of the capacitive element C1 of the first stage becomes smaller. Consequently, since the time constant becomes smaller, and charging is performed at the high speed, the voltage detection circuit 10 outputs the signal of the active level and the capacitive element C2 of the second stage is activated. If the capacitive element C2 of the second stage is activated, the charge pump circuit 101 charges the electric charge at the node N4 of the other end of the capacitive element C2 of the second stage, and thereafter, the transistor Tr3 is turned on, so that the electric charge accumulated in the capacitive element C2 of the second stage is transferred to the other end of the capacitive element C1 of the first stage. At this time, the capacitive load at the other end of the capacitive element C2 is relatively small, and the rising speed of the voltage of the line L2 is fast. The voltage detection circuit 120 outputs the signal of the active level, and the capacitive element C3 of the third stage is activated. Therefore, the boosting operation of three steps is performed by using the capacitive elements C1 to C3 of three stages.

In this manner, also in the configuration in which the voltage detection circuits 10 and 120 are added between the capacitive elements C1 to C3 of three stages, the number of stages of the capacitive element and the number of steps of the boosting operation used according to the magnitude of the output voltage can be dynamically adjusted. As a result, the operation of an extra capacitive element can be prevented, and the generation of excessive power consumption can be prevented. Therefore, the current efficiency of the charge pump circuit 101 can be improved.

Figure 10:
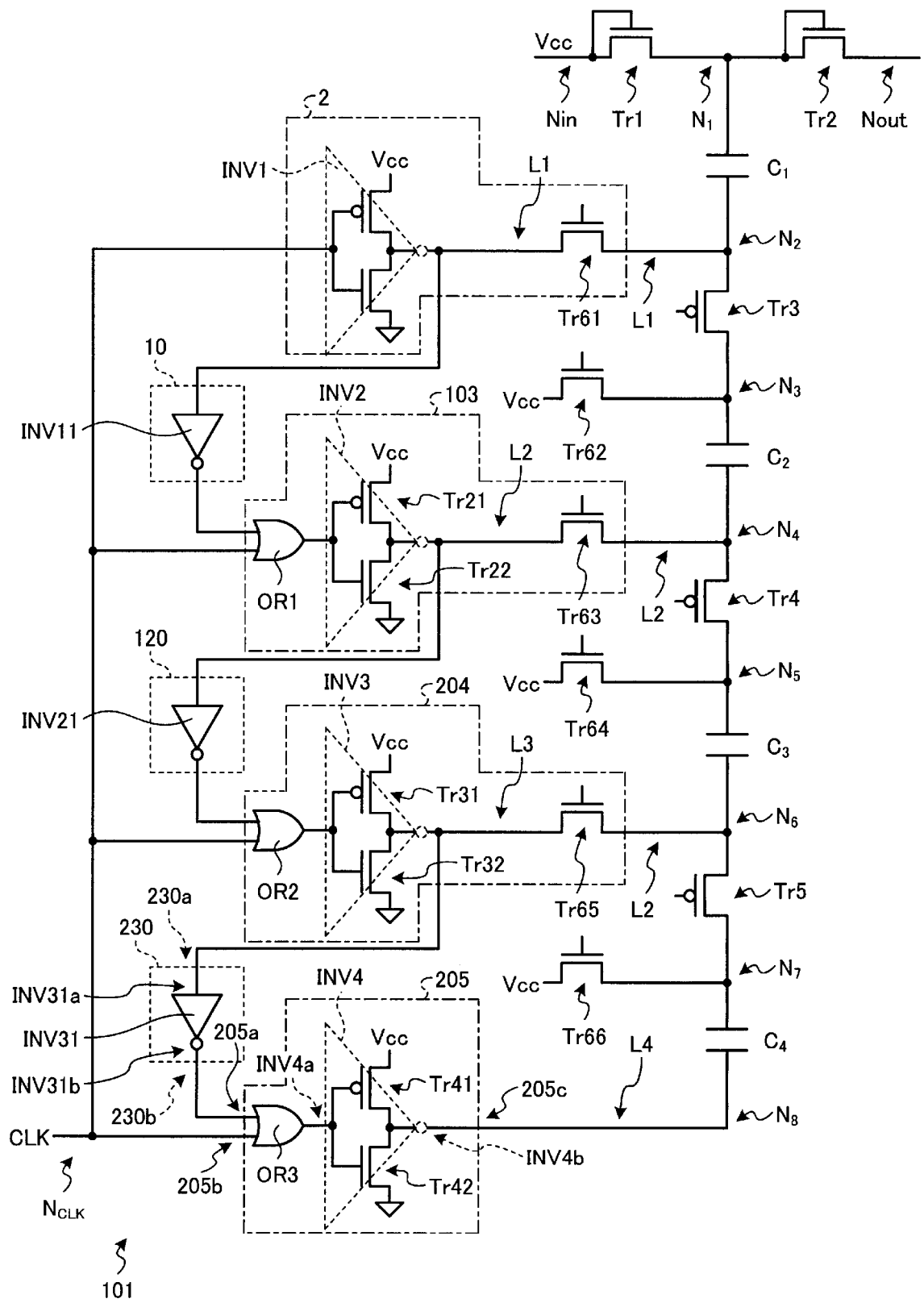
FIG. 10 is a circuit diagram illustrating a configuration of a charge pump circuit according to a second modification example of the embodiment.

Otherwise, as illustrated in FIG. 10, a charge pump circuit 201 may be configured to add a voltage detection circuit between the capacitive elements C1 to C4 of four stages. FIG. 10 is a circuit diagram illustrating a configuration of the charge pump circuit 201 according to a second modification example of the embodiment.

The charge pump circuit 201 includes a charge and discharge circuit 204 instead of the charge and discharge circuit 104 (refer to FIG. 9), and further includes a voltage detection circuit 230, a transistor Tr5, a capacitive element C4, and a charge and discharge circuit 205.

The charge and discharge circuit 204 includes a transistor Tr66 in addition to the OR gate OR2 and the inverter INV3. A transistor Tr65 is, for example, an NMOS transistor, having a source connected to an output node of the inverter INV3, a drain connected to the node N6, and a gate to which a predetermined signal is supplied. For example, the predetermined signal supplied to the gate of the transistor 65 is a signal obtained from the clock signal CLK. More specifically, when the clock signal CLK is in a period of the L level, the predetermined signal becomes an active level (for example, a voltage of Vcc+Vth), and when the clock signal CLK is in a period of the H level, the predetermined signal becomes a non-active level (for example, a ground voltage).

The transistor Tr65 has a function of alleviating the voltage load applied to the transistor Tr31 and the transistor Tr32 and improving the breakdown voltage characteristics of the circuit. The transistor Tr65 has a function of preventing backflow of the current from the node N6 to the inverter INV3.

The voltage detection circuit 230 includes an input node 230a and an output node 230b. The input node 230a is electrically connected to the signal line L3, and is connected, for example, to a node between the output node of the inverter INV3 and the transistor Tr66 in the signal line L3. The voltage detection circuit 230 can detect the voltage of the other end of the capacitive element C3 via the voltage of the signal line L3. The output node 230b is electrically connected to the charge and discharge circuit 205. The voltage detection circuit 230 can supply the detection result to the charge and discharge circuit 205.

The voltage detection circuit 230 is configured, for example, as an inverter INV31. The inverter INV31 includes an input node INV31a and an output node INV31b. The input node INV31a is connected to the input node 230a, and the output node INV31b is connected to the output node 230b.

The transistor Tr5 is disposed between the node N6 and a node N7. The transistor Tr5 is, for example, a PMOS transistor, having a source connected to the node N7, and a drain connected to the node N6.

The transistor Tr66 functions as a transistor for initializing the node N7 to the voltage Vcc. The transistor Tr66 is, for example, an NMOS transistor, having a gate connected to the clock node $N_{CLK}$, a source connected to the power supply voltage Vcc, and a drain connected to the node N7.

The capacitive element C4 functions as the capacitive element of the fourth stage in the charge pump circuit 201. The capacitive element C4 is disposed between the node N7 and a node N8. In the capacitive element C4, one end is electrically connected to the node N7, and the other end is electrically connected to the node N8. One end of the capacitive element C4 can be connected to the other end of the capacitive element C3 via the transistor Tr5 and the node N8.

The charge and discharge circuit 205 includes an input node 205a, an input node 205b, and an output node 205c. The input node 205a is electrically connected to the output node 230b of the voltage detection circuit 230. The input node 205b is electrically connected to the clock node $N_{CLK}$. The output node 205c is electrically connected to the node N8 via a line L4. The charge and discharge circuit 205 can charge the electric charge at the other end of the capacitive element C4 according to the detection result of the voltage detection circuit 230.

The charge and discharge circuit 205 includes an OR gate OR3 and the inverter INV4. In the OR gate OR3, a first input node is electrically connected to the input node 205a, a second input node is electrically connected to the input node 205b, and an output node is electrically connected to the inverter INV4. The inverter INV4 includes an input node INV4a and an output node INV4b. The input node INV4a is electrically connected to the OR gate OR3, and the output node INV4b is electrically connected to the line L4 via the output node 205c.

The inverter INV4 includes a transistor Tr41 and a transistor Tr42. The transistor Tr41 and the transistor Tr42 are connected to each other via an inverter. The transistor Tr41 is, for example, a PMOS transistor, having a source connected to the power supply voltage Vcc, a drain connected to the output node INV4b, and a gate connected to the input node INV4a. The transistor Tr42 is, for example, an NMOS transistor, having a source connected to a ground voltage, a drain connected to the output node INV4b, and a gate connected to the input node INV4a.

In the charge pump circuit 201 illustrated in FIG. 10, the charge pump circuit 201 charges the electric charge at the node N2 of the other end of the capacitive element C1 of the first stage in the transfer phase φ2 of the clock cycle. At this time, the voltage detection circuit 10 detects the voltage of the node N2 of the other end of the capacitive element C1 of the first stage.

If the output voltage is lower than $V_0$, the transistor Tr2 is easily turned on, the electric charge is easily transferred from one end of the capacitive element C1 of the first stage to the output node Nout side, and thus the current path from the power supply voltage Vcc to the output node Nout via the line L1, the capacitive element C1, and the transistor Tr2, is easily generated. The capacitive load at the other end of the capacitive element C1 of the first stage becomes large. Consequently, since the time constant becomes large, and the capacitive element C1 is charged at a low speed, the voltage detection circuit 10 continuously outputs the signal of the non-active level, and the capacitive element C2 of the second stage remains deactivated. The voltage detection circuit 120 continuously outputs the signal of the non-active level, and the capacitive element C3 of the third stage remains deactivated. The voltage detection circuit 230 continuously outputs the signal of the non-active level, and the capacitive element C4 of the fourth stage remains deactivated. The boosting operation (of one step) using the capacitive element C1 of one stage is performed without using the capacitive element C2 of the second stage, the capacitive element C3 of the third stage, and the capacitive element C4 of the fourth stage.

If the output voltage becomes a value higher than $V_0$ and lower than $V_1$ (refer to FIG. 12C), the transistor Tr2 is less likely to be turned on, and the electric charge is less likely to be transferred from one end of the capacitive element C1 of the first stage to the output node Nout side. The capacitive load at the other end of the capacitive element C1 of the first stage becomes smaller. Consequently, since the time constant becomes smaller, and the capacitive element C1 is charged at a high speed, the voltage detection circuit 10 outputs the signal of the active level, and activates the capacitive element C2 of the second stage. If the capacitive element C2 of the second stage is activated, the charge pump circuit 201 charges the electric charge at the node N4 of the other end of the capacitive element C2 of the second stage, and thereafter, the transistor Tr3 is turned on, so that the electric charge accumulated in the capacitive element C2 of the second stage is transferred to the other end of the capacitive element C1 of the first stage. At this time, capacitive load is comparatively large at the other end of the capacitive element C2, and the rising speed of voltage of the line L2 is slow. The voltage detection circuit 120 continuously outputs the signal of the non-active level, and the capacitive element C3 of the third stage remains deactivated. The voltage detection circuit 230 continuously outputs the signal of the non-active level, and the capacitive element C4 of the fourth stage remains deactivated. The boosting operation of two steps using the capacitive elements C1 and C2 of two stages is performed without using the capacitive element C3 of the third stage and the capacitive element C4 of the fourth stage.

If the output voltage is a value higher than $V_1$ and lower than $V_2$ (refer to FIG. 12C), the transistor Tr2 is much less likely to be turned on, and the electric charge is less likely to be transferred from one end of the capacitive element C1 of the first stage to the output node Nout side. The capacitive load at the other end of the capacitive element C1 of the first stage becomes smaller. Consequently, since the time constant becomes smaller, and the capacitive element C1 is charged at a high speed, the voltage detection circuit 10 outputs the signal of the active level and activates the capacitive element C2 of the second stage. If the capacitive element C2 of the second stage is activated, the charge pump circuit 201 charges the electric charge at the node N4 of the other end of the capacitive element C2 of the second stage, and thereafter, the transistor Tr3 is turned on, so that the electric charge accumulated in the capacitive element C2 of the second stage is transferred to the other end of the capacitive element C1 of the first stage. At this time, capacitive load at the other end of the capacitive element C2 is relatively small, and the rising speed of the voltage of the line L2 is fast. The voltage detection circuit 120 outputs the signal of the active level, and the capacitive element C3 of the third stage is activated. If the capacitive element C3 of the third stage is activated, the charge pump circuit 201 charges the electric charge at the node N6 of the other end of the capacitive element C3 of the third stage, and thereafter, the transistor Tr4 is turned on, so that the electric charge accumulated in the capacitive element C3 of the third stage is transferred to the other end of the capacitive element C2 of the second stage. At this time, the capacitive load at the other end of the capacitive element C3 is comparatively large, and the rising speed of the voltage of the line L3 is slow. The voltage detection circuit 230 continuously outputs the signal of the non-active level, and the capacitive element C4 of the fourth stage remains deactivated. Therefore, the boosting operation of three steps using the capacitive elements C1 to C3 of three stages is performed without using the capacitive element C4 of the fourth stage.

If the output voltage is a value higher than $V_2$, the transistor Tr2 is much less likely to be turned on, and the electric charge is less likely to be transferred from one end of the capacitive element C1 of the first stage to the output node Nout side. The charging time for raising voltage of the other end of the capacitive element C1 of the first stage becomes shorter. Consequently, since the time constant becomes smaller, and charging is performed at a high speed, the voltage detection circuit 10 outputs the signal of the active level, and the capacitive element C2 of the second stage is activated. If the capacitive element C2 of the second stage is activated, the charge pump circuit 201 charges the electric charge at the node N4 of the other end of the capacitive element C2 of the second stage, and thereafter, the transistor Tr3 is turned on, so that the electric charge accumulated in the capacitive element C2 of the second stage is transferred to the other end of the capacitive element C1 of the first stage. At this time, the capacitive load at the other end of the capacitive element C2 is relatively small, and the rising speed of the voltage of the line L2 is fast. The voltage detection circuit 120 outputs the signal of the active level, and the capacitive element C3 of the third stage is activated. If the capacitive element C3 of the third stage is activated, the charge pump circuit 201 charges the electric charge at the node N6 of the other end of the capacitive element C3 of the third stage, and thereafter, the transistor Tr4 is turned on, so that the electric charge accumulated in the capacitive element C3 of the third stage is transferred to the other end of the capacitive element C2 of the second stage. At this time, the capacitive load at the other end of the capacitive element C3 is relatively small, and the rising speed of the voltage of the line L3 is fast. Therefore, the voltage detection circuit 230 outputs the signal of active level, and the capacitive element C4 of the fourth stage is activated. If the capacitive element C4 of the fourth stage is activated, the charge pump circuit 201 charges the electric charge at the node N8 of the other end of the capacitive element C4 of the fourth stage, and thereafter, the transistor Tr5 is turned on so that the electric charge accumulated in the capacitive element C4 of the fourth stage is transferred to the other end of the capacitive element C3 of the third stage. Therefore, the boosting operation of four steps using the capacitive elements C1 to C4 of four stages is performed.

As described above, also in the configuration in which the voltage detection circuits 10, 120, and 230 are added between the capacitive elements C1 to C4 of four stages, the number of stages of the capacitive element and the number of steps of the boosting operation used according to the magnitude of the output voltage can be dynamically adjusted. As a result, the operation of an extra capacitive element can be prevented, and the generation of excessive power consumption can be prevented. Therefore, the current efficiency of the charge pump circuit 201 can be improved.

Figure 11:
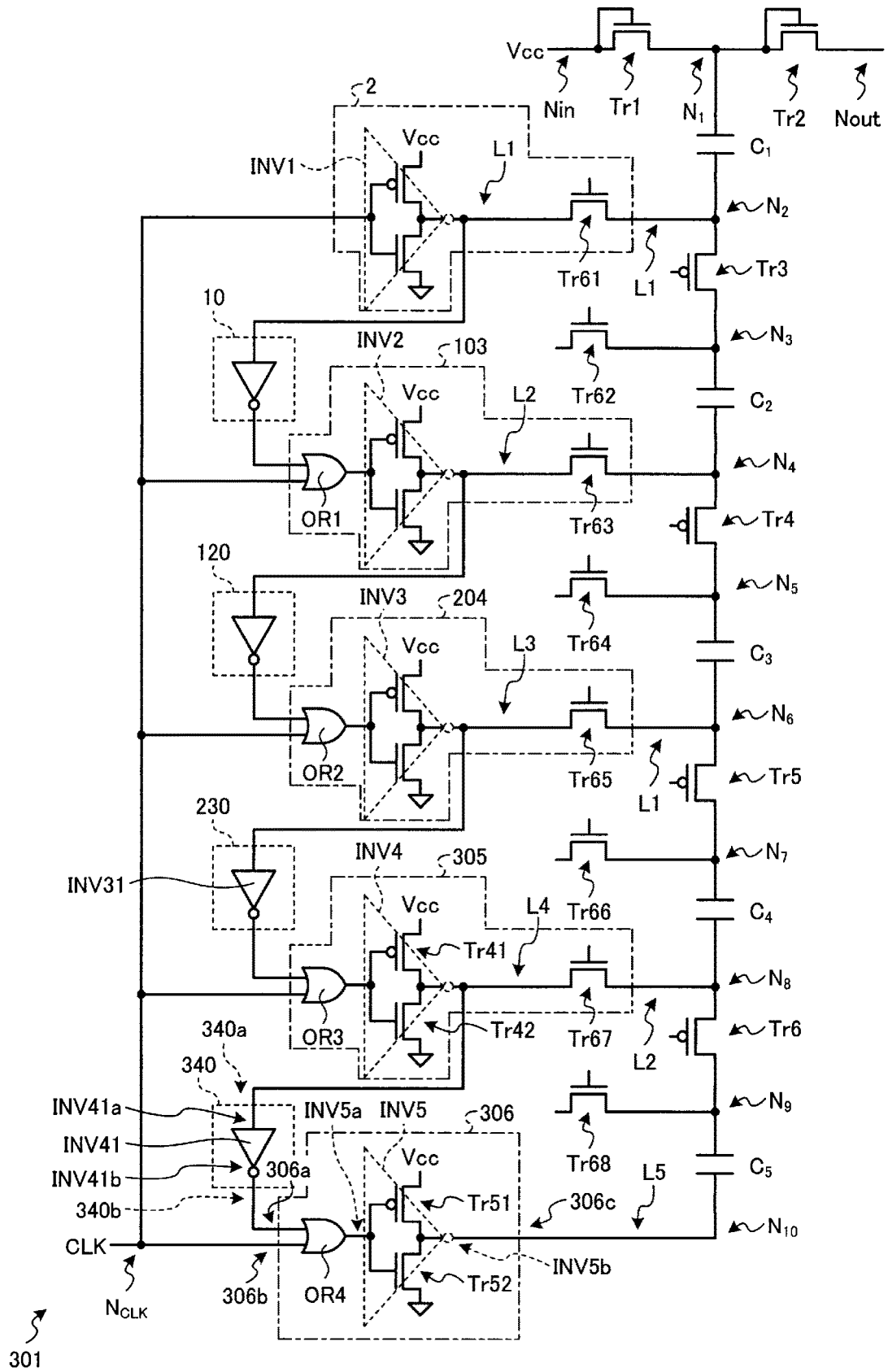
FIG. 11 is a circuit diagram illustrating a configuration of a charge pump circuit according to a third modification example of the embodiment.

Otherwise, as illustrated in FIG. 11, a voltage detection circuit between the capacitive elements C1 to C5 of five stages may be added to a charge pump circuit 301. FIG. 11 is a circuit diagram illustrating a configuration of the charge pump circuit 301 according to a third modification example of the embodiment.

The charge pump circuit 301 includes a charge and discharge circuit 305 instead of the charge and discharge circuit 205 (refer to FIG. 10), and further includes a voltage detection circuit 340, a transistor Tr6, a capacitive element C5, and a charge and discharge circuit 306.

The charge and discharge circuit 305 includes the transistor Tr66 in addition to the OR gate OR3 and the inverter INV4. A transistor Tr67 is, for example, an NMOS transistor, having a source connected to an output node of the inverter INV4, a drain connected to the node N8, and a gate to which a predetermined signal is supplied. For example, the predetermined signal supplied to the gate of the transistor Tr. 67 is a signal obtained from the clock signal CLK. More specifically, when the clock signal CLK is in a period of the L level, the predetermined signal becomes an active level (for example, a voltage of Vcc+Vth), and when the clock signal CLK is in a period of the H level, the predetermined signal becomes a non-active level (for example, a ground voltage).

The transistor Tr67 has a function of alleviating the voltage load applied to the transistor Tr41 and the transistor Tr42 and improving breakdown voltage characteristics of the circuit. The transistor Tr67 has a function of preventing backflow of the current from the node N8 to the inverter INV4.

The voltage detection circuit 340 has an input node 340a and an output node 340b. The input node 340a is electrically connected to the signal line L4, and is connected, for example, to a node between the output node of the inverter INV4 and the transistor Tr67 in the signal line L4. The voltage detection circuit 340 can detect the voltage of the other end of the capacitive element C4 via the voltage of the signal line L4. The output node 340b is electrically connected to the charge and discharge circuit 306. Therefore, the voltage detection circuit 340 can supply the detection result to the charge and discharge circuit 306.

The voltage detection circuit 340 is configured, for example, as the inverter INV41. The inverter INV41 includes an input node INV41a and an output node INV41b. The input node INV41a is connected to the input node 340a, and the output node INV41b is connected to the output node 340b.

The transistor Tr6 is disposed between the node N8 and a node N9. The transistor Tr6 is, for example, a PMOS transistor, having a source connected to the node N9, and a drain connected to the node N8.

The capacitive element C5 functions as a capacitive element of the fifth stage in the charge pump circuit 301. The capacitive element C5 is disposed between the node N9 and a node N10. In the capacitive element C5, one end is electrically connected to the node N9, and the other end is electrically connected to the node N10. One end of the capacitive element C5 can be connected to the other end of the capacitive element C4 via the transistor Tr6 and the node N10.

The charge and discharge circuit 306 includes an input node 306a, an input node 306b, and an output node 306c. The input node 306a is electrically connected to the output node 340b of the voltage detection circuit 340. The input node 306b is electrically connected to the clock node $N_{CLK}$. The output node 306c is electrically connected to the node N10 via a line L5. The charge and discharge circuit 306 can charge the electric charge at the other end of the capacitive element C5 according to the detection result of the voltage detection circuit 340.

The charge and discharge circuit 306 includes an OR gate OR4 and an inverter INV5. In the OR gate OR4, the first input node is electrically connected to the input node 306a, the second input node is electrically connected to the input node 306b, and the output node is electrically connected to the inverter INV5. The inverter INV5 includes an input node INV5a and an output node INV5b. The input node INV5a is electrically connected to the OR gate OR4, and the output node INV5b is electrically connected to the line L5 via the output node 306c.

The inverter INV5 includes a transistor Tr51 and a transistor Tr52. The transistor Tr51 and the transistor Tr52 are connected to each other via an inverter. The transistor Tr51 is, for example, a PMOS transistor, having a source connected to the power supply voltage Vcc, a drain connected to the output node INV5b, and a gate connected to the input node INV5a. The transistor Tr52 is, for example, an NMOS transistor, having a source connected to a ground voltage, a drain connected to the output node INV5b, and a gate connected to the input node INV5a.

In the charge pump circuit 301 illustrated in FIG. 11, the charge pump circuit 301 charges the electric charge at the node N2 of the other end of the capacitive element C1 of the first stage in the transfer phase ϕ2 of the clock cycle. At this time, the voltage detection circuit 10 detects the voltage of the node N2 of the other end of the capacitive element C1 of the first stage.

If the output voltage is lower than $V_0$, since the transistor Tr2 is easily turned on, and the electric charge is easily transferred from one end of the capacitive element C1 of the first stage to the output node Nout side, the current path from the power supply voltage Vcc to the output node Nout via the line L1, the capacitive element C1, and the transistor Tr2, is easily generated. The capacitive load in the capacitive element C1 of the first stage becomes large. Consequently, since the time constant becomes large, and the capacitive element C1 is charged at a low speed, the voltage detection circuit 10 continuously outputs the signal of the non-active level, and the capacitive element C2 of the second stage remains deactivated. The voltage detection circuit 120 continuously outputs the signal of the non-active level, and the capacitive element C3 of the third stage remains deactivated. The voltage detection circuit 230 continuously outputs the signal of the non-active level, and the capacitive element C4 of the fourth stage remains deactivated. The voltage detection circuit 340 continuously outputs the signal of the non-active level, and the capacitive element C5 of the fifth stage remains deactivated. Therefore, the boosting operation (of one step) using the capacitive element C1 of one stage is performed without using the capacitive element C2 of the second stage, the capacitive element C3 of the third stage, the capacitive element C4 of the fourth stage, and the capacitive element C5 of the fifth stage.

If the output voltage is a value higher than $V_0$ and lower than $V_1$ (refer to FIG. 12D), the transistor Tr2 is less likely to be turned on, and the electric charge is less likely to be transferred from one end of the capacitive element C1 of the first stage to the output node Nout side. The current path from the power supply voltage Vcc to the output node Nout via the line L1, the capacitive element C1, and the transistor Tr2, is less likely to be generated, and the capacitive load in the capacitive element C1 of the first stage becomes smaller. Consequently, since the time constant becomes smaller, and the capacitive element C1 is charged at a high speed, the voltage detection circuit 10 outputs the signal of the active level, and the capacitive element C2 of the second stage is activated. If the capacitive element C2 of the second stage is activated, the charge pump circuit 301 charges the electric charge at the node N4 of the other end of the capacitive element C2 of the second stage, and thereafter, the transistor Tr3 is turned on, so that the electric charge accumulated in the capacitive element C2 of the second stage is transferred to the other end of the capacitive element C1 of the first stage. At this time, the capacitive load at the other end of the capacitive element C2 is comparatively large, and the rising speed of the voltage of the line L2 is slow. The voltage detection circuit 120 continuously outputs the signal of the non-active level, and the capacitive element C3 of the third stage remains deactivated. The voltage detection circuit 230 continuously outputs the signal of the non-active level, and the capacitive element C4 of the fourth stage remains deactivated. The voltage detection circuit 340 continuously outputs the signal of the non-active level, and the capacitive element C5 of the fifth stage remains deactivated. Therefore, the boosting operation of two steps using the capacitive elements C1 and C2 of two stages is performed without using the capacitive element C3 of the third stage, the capacitive element C4 of the fourth stage, and the capacitive element C5 of the fifth stage.

If the output voltage is a value higher than $V_1$ and lower than $V_2$ (refer to FIG. 12D), the transistor Tr2 is much less likely to be turned on, and the electric charge is less likely to be transferred from one end of the capacitive element C1 of the first stage to the output node Nout side. The current path from the power supply voltage Vcc to the output node Nout via the line L1, the capacitive element C1, and the transistor Tr2, is less likely to be generated, and capacitive load in the capacitive element C1 of the first stage becomes smaller. Consequently, since the time constant becomes smaller, and the capacitive element C1 is charged at a high speed, the voltage detection circuit 10 outputs the signal of the active level, and the capacitive element C2 of the second stage is activated. If the capacitive element C2 of the second stage is activated, the charge pump circuit 301 charges the electric charge to the node N4 of the other end of the capacitive element C2 of the second stage, and thereafter, the transistor Tr3 is turned on, so that the electric charge accumulated in the capacitive element C2 of the second stage is transferred to the other end of the capacitive element C1 of the first stage. At this time, the capacitive load at the other end of the capacitive element C2 is relatively small, and the rising speed of the voltage of the line L2 is fast. The voltage detection circuit 120 outputs the signal of the active level, and the capacitive element C3 of the third stage is activated. If the capacitive element C3 of the third stage is activated, the charge pump circuit 301 charges the electric charge at the node N6 of the other end of the capacitive element C3 of the third stage, and thereafter, the transistor Tr4 is turned on, so that the electric charge accumulated in the capacitive element C3 of the third stage is transferred to the other end of the capacitive element C2 of the second stage. At this time, the capacitive load at the other end of the capacitive element C3 is comparatively large, and the rising speed of the voltage of the line L3 is slow. Therefore, the voltage detection circuit 230 continuously outputs the signal of the non-active level, and the capacitive element C4 of the fourth stage remains deactivated. The voltage detection circuit 340 continuously outputs the signal of the non-active level, and the capacitive element C5 of the fifth stage remains deactivated. Therefore, the boosting operation of three steps using the capacitive elements C1 to C3 of three stages is performed without using the capacitive element C4 of the fourth stage and the capacitive element C5 of the fifth stage.

If the output voltage is a value higher than $V_2$ and lower than $V_3$ (refer to FIG. 12D), the transistor Tr2 is much less likely to be turned on, and thus the electric charge from one end of the capacitive element C1 of the first stage is less likely to be transferred to the output node Nout side. The current path from the power supply voltage Vcc to the output node Nout via the line L1, the capacitive element C1, and the transistor Tr2, is less likely to be generated, and the capacitive load in the capacitive element C1 of the first stage becomes smaller. Consequently, since the time constant becomes smaller, and the capacitive element C1 is charged at a high speed, the voltage detection circuit 10 outputs the signal of the active level, and the capacitive element C2 of the second stage is activated. If the capacitive element C2 of the second stage is activated, the charge pump circuit 301 charges the electric charge to the node N4 of the other end of the capacitive element C2 of the second stage, and thereafter, the transistor Tr3 is turned on, so that the electric charge accumulated in the capacitive element C2 of the second stage is transferred to the other end of the capacitive element C1 of the first stage. At this time, the capacitive load at the other end of the capacitive element C2 is relatively small, and the rising speed of the voltage of the line L2 is fast. The voltage detection circuit 120 outputs the signal of the active level, and the capacitive element C3 of the third stage is activated. If the capacitive element C3 of the third stage is activated, the charge pump circuit 301 charges the electric charge at the node N6 of the other end of the capacitive element C3 of the third stage, and thereafter, the transistor Tr4 is turned on, the electric charge accumulated in the capacitive element C3 of the third stage is transferred to the other end of the capacitive element C2 of the second stage. At this time, the capacitive load at the other end of the capacitive element C3 is relatively small, and the rising speed of the voltage of the line L3 is fast. The voltage detection circuit 230 outputs the signal of the active level, and the capacitive element C4 of the fourth stage is activated. If the capacitive element C4 of the fourth stage is activated, the charge pump circuit 301 charges the electric charge at the node N8 of the other end of the capacitive element C4 of the fourth stage, and thereafter, the transistor Tr5 is turned on, so that the electric charge accumulated in the capacitive element C4 of the fourth stage is transferred to the other end of the capacitive element C3 of the third stage. The voltage detection circuit 340 continuously outputs the signal of the non-active level, the capacitive element C5 of the fifth stage remains deactivated. Therefore, the boosting operation of four steps using the capacitive elements C1 to C4 of four stages is performed without using the capacitive element C5 of the fifth stage.

If the output voltage is a value higher than $V_3$, the transistor Tr2 is much less likely to be turned on, and the electric charge from one end of the capacitive element C1 of the first stage is less likely to be transferred to the output node Nout side. The current path from the power supply voltage Vcc to the output node Nout via the line L1, the capacitive element C1, and the transistor Tr2, is less likely to be generated, and the capacitive load in the capacitive element C1 of the first stage becomes smaller. Consequently, since the time constant becomes smaller, and the capacitive element C1 is charged at a high speed, the voltage detection circuit 10 outputs the signal of the active level, and the capacitive element C2 of the second stage is activated. If the capacitive element C2 of the second stage is activated, the charge pump circuit 301 charges the electric charge to the node N4 of the other end of the capacitive element C2 of the second stage, and thereafter, the transistor Tr3 is turned on, so that the electric charge accumulated in the capacitive element C2 of the second stage is transferred to the other end of the capacitive element C1 of the first stage. At this time, the capacitive load at the other end of the capacitive element C2 is relatively small, and the rising speed of the voltage of the line L2 is fast. Therefore, the voltage detection circuit 120 outputs the signal of the active level, the capacitive element C3 of the third stage is activated. If the capacitive element C3 of the third stage is activated, the charge pump circuit 301 charges the electric charge at the node N6 of the other end of the capacitive element C3 of the third stage, and thereafter, the transistor Tr4 is turned on, so that the electric charge accumulated in the capacitive element C3 of the third stage is transferred to the other end of the capacitive element C2 of the second stage. At this time, capacitive load at the other end of the capacitive element C3 is relatively small, and the rising speed of the voltage of the line L3 is fast. The voltage detection circuit 230 outputs the signal of the active level, and the capacitive element C4 of the fourth stage is activated. If the capacitive element C4 of the fourth stage is activated, the charge pump circuit 301 charges the electric charge at the node N8 of the other end of the capacitive element C4 of the fourth stage, and thereafter, the transistor Tr5 is turned on, the electric charge accumulated in the capacitive element C4 of the fourth stage is transferred to the other end of the capacitive element C3 of the third stage. At this time, the capacitive load at the other end of the capacitive element C4 is relatively small, and the rising speed of the voltage of the line L4 is fast. The voltage detection circuit 340 outputs the signal of the active level, and the capacitive element C5 of the fifth stage is activated. If the capacitive element C5 of the fifth stage is activated, the charge pump circuit 301 charges the electric charge at the node N10 of the other end of the capacitive element C5 of the fifth stage, and thereafter, the transistor Tr6 is turned on, so that the electric charge accumulated in the capacitive element C5 of the fifth stage is transferred to the other end of the capacitive element C4 of the fourth stage. Therefore, the boosting operation of five steps using the capacitive elements C1 to C5 of five stages is performed.

As described above, also in the configuration in which the voltage detection circuits 10, 120, 230, and 340 are added between the capacitive elements C1 to C5 of five stages, the number of stages of the capacitive element and the number of steps of the boosting operation used according to the magnitude of the output voltage can be dynamically adjusted. As a result, the operation of an extra capacitive element can be prevented, and the generation of excessive power consumption can be prevented. Therefore, the current efficiency of the charge pump circuit 301 can be improved.

Subsequently, a relationship between the number of stages of the capacitive element and the pump characteristics in the charge pump circuit is described with reference to FIGS. 12A to 12D. FIGS. 12A to 12D are diagrams illustrating characteristics of the charge pump circuit according to the embodiment and the first to third modification examples thereof.

If the number of stages of the capacitive element in the charge pump circuit is M, effective current efficiency $I_{eff}$ of the charge pump circuit is expressed by Expression 1.

$$I_{eff} \propto 1/(M+1) \qquad \text{Expression 1}$$

A maximum voltage that can be generated by the charge pump circuit is set as $V_{max}$ and is expressed by Expression 2.

$$V_{max} = (M+1) \times Vcc \qquad \text{Expression 2}$$

As expressed by Expressions 1 and 2, if the number of stages M of the capacitive element is increased, the effective current efficiency $I_{eff}$ decreases, but the maximum voltage $V_{max}$ can be raised.

Figure 12A:
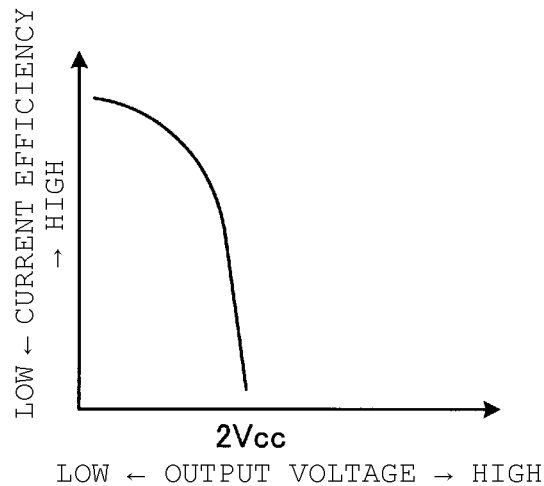
FIGS. 12A to 12D are diagrams illustrating characteristics of the charge pump circuit according to the embodiment and the first to third modification examples thereof.

For example, in the case of M=2 (that is, in a case of the configuration of FIG. 4), as illustrated in FIG. 12A, there is tendency in that as the output voltage is raised, the current efficiency decreases, and there is tendency in that the current efficiency rapidly decreases near the maximum voltage of 2 Vcc.

Figure 12C:
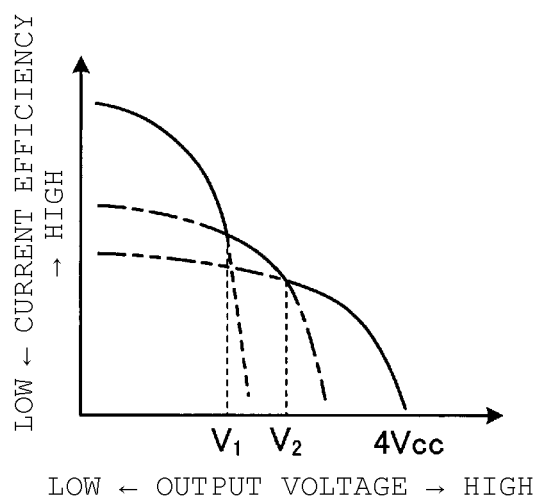
Figure 12B:
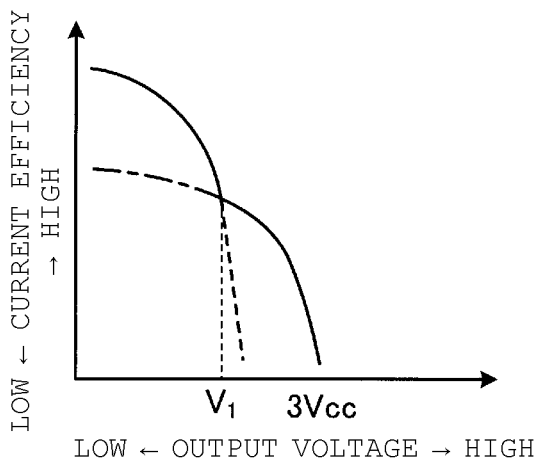

In the case of M=3 (that is, in a case of the configuration of FIG. 9), as illustrated in FIG. 12B, there is tendency in that the output voltage is raised, and the current efficiency decreases. However, if the output voltage exceeds $V_1$, the boosting operation of two stages illustrated by the dotted line is dynamically substituted with the boosting operation of three stages illustrated by the alternate long and short dash line. The decrease of the current efficiency is prevented, and the higher maximum voltage of 3 Vcc can be generated. $V_1$ is a value between Vcc and 2 Vcc.

In the case of M=4 (that is, in a case of the configuration of FIG. 10), as illustrated in FIG. 12C, there is tendency in that the output voltage is raised, and the current efficiency is decreased. However, if the output voltage exceeds $V_1$, the boosting operation of two stages illustrated by the dotted line is dynamically substituted with the boosting operation of three stages illustrated by the alternate long and short dash line. If the output voltage exceeds $V_2$, the boosting operation of three stages illustrated by the alternate long and short dash line is dynamically substituted with the boosting operation of four stages illustrated by the alternate long and two short dashes line. Therefore, the decrease of the current efficiency is prevented in a stepwise manner, and the higher maximum voltage of 4 Vcc can be generated. $V_2$ is a value between 2 Vcc and 3 Vcc.

Figure 12D:
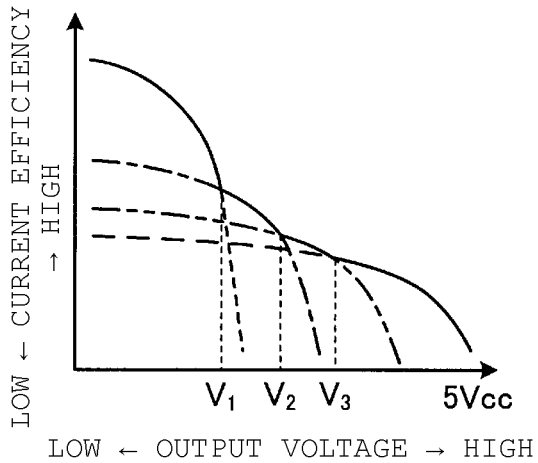

In the case of M=5 (that is, in a case of the configuration of FIG. 11), as illustrated in FIG. 12D, there is tendency in that the output voltage is raised, and the current efficiency decreases. However, if the output voltage exceeds $V_1$, the boosting operation of two stages illustrated by the dotted line is dynamically substituted with the boosting operation of three stages illustrated by the alternate long and short dash line. If the output voltage exceeds $V_2$, the boosting operation of three stages illustrated by the alternate long and short dash line is dynamically substituted with the boosting operation of four stages illustrated by the alternate long and two short dashes line. If the output voltage exceeds $V_3$, the boosting operation of four stages illustrated by the alternate long and two short dashes line is dynamically substituted with the boosting operation of five stages illustrated by the dotted line. Therefore, the decrease of the current efficiency is prevented in a stepwise manner, and the higher maximum voltage of 5 Vcc can be generated. $V_3$ is a value between 3 Vcc and 4 Vcc.

Figure 13:
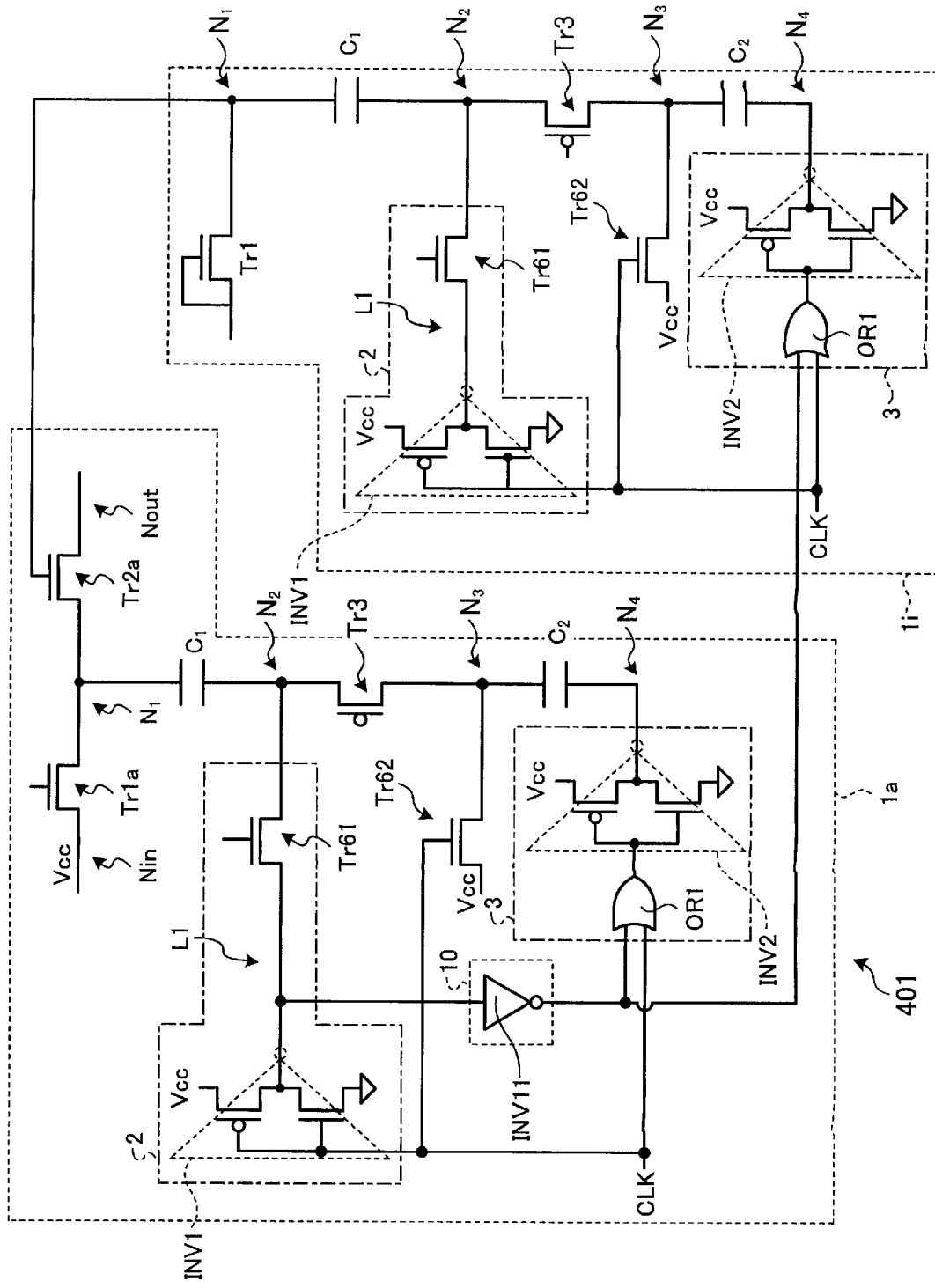
FIG. 13 is a circuit diagram illustrating a configuration of a charge pump circuit according to a fourth modification example of the embodiment.

As illustrated in FIG. 13, a charge pump circuit 401 may be configured as a threshold cancel type. FIG. 13 is a circuit diagram illustrating a configuration of the charge pump circuit 401 according to a fourth modification example of the embodiment.

The charge pump circuit 401 includes a main charge pump circuit 1a and a sub-charge pump circuit 1i. The main charge pump circuit 1a can be obtained by substituting the diode-connected transistors Tr1 and Tr2 in the charge pump circuit 1 illustrated in FIG. 4 with transistors Tr1a and Tr2a that are not diode-connected. The sub-charge pump circuit 1i can be obtained by omitting the transistor Tr2 in the charge pump circuit 1 illustrated in FIG. 4. The voltage detection circuit 10 is used in common in the main charge pump circuit 1a and the sub-charge pump circuit 1i. Alternatively, the voltage detection circuits 10 may be separately provided.

In the transistor Tr1a, a gate is not connected to a drain, and an active level (for example, Vcc+Vth) is supplied to a gate. In the transistor Tr1, a gate is not connected to the drain, and the node N1 of the sub-charge pump circuit 1i is connected to the gate. That is, the node N1 connected to the drain of the transistor Tr2 and N1 connected to the gate in the charge pump circuit 1 illustrated in FIG. 4 are electrically separated in the transistor Tr2a. Accordingly, even if the electric charge is transferred from the node N1 to the output node Nout via the drain and the source of the transistor Tr2a, the electric charge is stored in the gate of the transistor Tr2a, and thus the voltage between the gate and the source of the transistor Tr2a can be secured, so that the operation of the transistor Tr2a can be stabilized.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure. In the above embodiments, the semiconductor storage device including a memory cell array is exemplified and described, but the present disclosure can be appropriately applied to a semiconductor device including a charge pump. For example, the above embodiments may be applied to a discrete (single-function) semiconductor device that professionally provides a function as a charge pump. The electronic circuit according to the above embodiments may not be mounted on the semiconductor substrate and may be mounted on an electronic device.

What is claimed is:

1. An electronic circuit, comprising:
a charge pump circuit,
wherein the charge pump circuit includes a first transistor having a drain connected to an input node of the charge pump circuit, and a source connected to a first node;
a second transistor having a drain connected to the first node, and a source connected to an output node of the charge pump circuit;
a first capacitive element having one end connected to the first node, and the other end connected to a second node;
a first inverter which includes an input node to which a clock signal is supplied and an output node which is connected to the second node via a first line;
a first voltage detection circuit which includes an input node electrically connected to the first line;
a third transistor having a source connected to a third node, and a drain connected to the second node;
a second inverter which includes an input node which is electrically connected to an output of the first voltage detection circuit and an output node which is connected to a fourth node via a second line; and
a second capacitive element having one end connected to the fourth node and the other end connected to the third node.

2. The electronic circuit according to claim 1, wherein the charge pump circuit further includes a first logical OR gate including
a first input node which is electrically connected to an output node of the first voltage detection circuit,
a second input node to which the clock signal is supplied, and
an output node which is connected to the input node of the second inverter.

3. The electronic circuit according to claim 2, wherein the charge pump circuit further includes
a second voltage detection circuit which includes an input node which is electrically connected to the second line,
a fourth transistor having a source connected to a fifth node, and a drain connected to the fourth node,
a second logical OR gate which includes a first input node which is electrically connected to an output node of the second voltage detection circuit, a second input node to which the clock signal is supplied, and an output node,
a third inverter which includes an input node which is connected to an output node of the second logical OR gate and an output node which is connected to a sixth node, and
a third capacitive element having one end connected to the sixth node, and the other end connected to the fifth node.

4. The electronic circuit according to claim 1, wherein the first voltage detection circuit is an inverter having an input connected to the input node of the first voltage detection circuit and an output connected to the output node of the first voltage detection circuit.

5. The electronic circuit according to claim 1, wherein the charge pump circuit further includes a fourth transistor having a gate to which the clock signal is supplied, a source connected to a power supply node, and a drain connected to the third node.

6. The electronic circuit according to claim 5, wherein the input node of the charge pump circuit is connected to the power supply node.

7. The electronic circuit according to claim 1, wherein the charge pump circuit further includes
a second voltage detection circuit which includes an input node which is electrically connected to the second line,
a fourth transistor having a source connected to a fifth node, and a drain connected to the fourth node,
a third inverter which includes an input node which is electrically connected to an output of the second voltage detection circuit and an output node which is connected to a sixth node, and
a third capacitive element having one end connected to the sixth node, and the other end connected to the fifth node.

8. An electronic circuit comprising:
a charge pump circuit;
wherein the charge pump circuit includes
a first capacitive element having one end connected to a node between two transistors connected in series;
a first charge and discharge circuit which uses a power supply voltage and charges the other end of the first capacitive element;
a first voltage detection circuit which detects a voltage of the other end of the first capacitive element;
a second capacitive element having one end connected to the other end of the first capacitive element via a first transistor; and
a second charge and discharge circuit which can charge an electric charge at the other end of the second capacitive element according to a detection result of the first voltage detection circuit.

9. The electronic circuit according to claim 8,
wherein the charge pump circuit further includes
a second voltage detection circuit which detects a voltage of the other end of the second capacitive element,
a third capacitive element having one end connected to the other end of the second capacitive element via a second transistor, and
a third charge and discharge circuit which can charge an electric charge at the other end of the third capacitive element according to a detection result of the second voltage detection circuit.

10. The electronic circuit according to claim 8, wherein the first voltage detection circuit is an inverter having an input connected to an input node of the first voltage detection circuit and an output connected to an output node of the first voltage detection circuit.

11. A semiconductor device comprising:
a semiconductor substrate; and
an electronic circuit mounted on the semiconductor substrate, wherein the electronic circuit includes a charge pump circuit, and the charge pump circuit includes:
a first transistor having a drain connected to an input node of the charge pump circuit, and a source connected to a first node;
a second transistor having a drain connected to the first node, and a source connected to an output node of the charge pump circuit;
a first capacitive element having one end connected to the first node, and the other end connected to a second node;

a first inverter which includes an input node to which a clock signal is supplied and an output node which is connected to the second node via a first line;

a first voltage detection circuit which includes an input node electrically connected to the first line;

a third transistor having a source connected to a third node, and a drain connected to the second node;

a second inverter which includes an input node which is electrically connected to the first voltage detection circuit and an output node which is connected to a fourth node via a second line; and a second capacitive element having one end connected to the fourth node and the other end connected to the third node.

12. The semiconductor device according to claim 11, further comprising:

a memory cell array mounted on the semiconductor substrate, wherein the electronic circuit is disposed on the semiconductor substrate and around the periphery of the memory cell array.

13. The semiconductor device according to claim 12, wherein the charge pump circuit further includes a first logical OR gate including a first input node which is electrically connected to an output node of the first voltage detection circuit, a second input node to which the clock signal is supplied, and an output node which is connected to the input node of the second inverter.

14. The semiconductor device according to claim 13, wherein the charge pump circuit further includes a second voltage detection circuit which includes an input node which is electrically connected to the second line, a fourth transistor having a source connected to a fifth node, and a drain connected to the fourth node, a second logical OR gate which includes a first input node which is electrically connected to an output node of the second voltage detection circuit, a second input node to which the clock signal is supplied, and an output node, a third inverter which includes an input node which is connected to an output node of the second logical OR gate and an output node which is connected to a sixth node, and a third capacitive element having one end connected to the sixth node, and the other end connected to the fifth node.

15. The semiconductor device according to claim 12, wherein the first voltage detection circuit is an inverter having an input connected to the input node of the first voltage detection circuit and an output connected to the output node of the first voltage detection circuit.

16. The semiconductor device according to claim 12, wherein the charge pump circuit further includes a fourth transistor having a gate to which the clock signal is supplied, a source connected to a power supply node, and a drain connected to the third node.

17. The semiconductor device according to claim 16, wherein the input node of the charge pump circuit is connected to the power supply node.

18. The semiconductor device according to claim 12, wherein the charge pump circuit further includes a second voltage detection circuit which includes an input node which is electrically connected to the second line, a fourth transistor having a source connected to a fifth node, and a drain connected to the fourth node, a third inverter which includes an input node which is electrically connected to an output of the second voltage detection circuit and an output node which is connected to a sixth node, and a third capacitive element having one end connected to the sixth node, and the other end connected to the fifth node.

* * * * *